(12) United States Patent
Akimoto et al.

(10) Patent No.: US 7,758,340 B2
(45) Date of Patent: Jul. 20, 2010

(54) HEATING DEVICE AND HEATING METHOD

(75) Inventors: Masami Akimoto, Koshi (JP); Shinichi Hayashi, Koshi (JP); Naruaki Iida, Koshi (JP); Hiroaki Inadomi, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 273 days.

(21) Appl. No.: 11/617,319

(22) Filed: Dec. 28, 2006

(65) Prior Publication Data
US 2007/0160947 A1 Jul. 12, 2007

(30) Foreign Application Priority Data
Jan. 6, 2006 (JP) ............................. 2006-001873

(51) Int. Cl.
*F27D 3/00* (2006.01)
(52) U.S. Cl. .................... 432/239; 432/243; 219/460.1; 438/716; 414/939
(58) Field of Classification Search ................. 432/239, 432/243, 253, 258; 219/443.1, 449.1, 460.1; 118/724, 729, 732; 438/715, 716; 414/936, 414/937, 939
See application file for complete search history.

(56) References Cited

U.S. PATENT DOCUMENTS

| 4,518,848 | A | 5/1985 | Weber |
| 6,329,304 | B1 * | 12/2001 | Kuznetsov et al. .......... 438/799 |
| 6,336,775 | B1 * | 1/2002 | Morita et al. ................. 406/88 |
| 6,414,280 | B1 * | 7/2002 | Nishitani et al. ............ 219/411 |
| 6,518,548 | B2 * | 2/2003 | Sugaya et al. ............ 219/444.1 |
| 6,719,499 | B1 * | 4/2004 | Kuznetsov et al. ........... 406/90 |
| 7,048,488 | B1 * | 5/2006 | Kuznetsov et al. .......... 414/152 |
| 7,147,720 | B2 * | 12/2006 | Aggarwal et al. ........... 118/724 |

(Continued)

FOREIGN PATENT DOCUMENTS

JP          57-128940          8/1982

(Continued)

*Primary Examiner*—Gregory A Wilson
(74) *Attorney, Agent, or Firm*—Oblon, Spivak, McClelland, Maier & Neustadt, L.L.P.

(57) ABSTRACT

A heating device provided with a cooling plate and a heating plate is formed in a low height, and floats a substrate above the cooling plate and the heating plate and moves the substrate horizontally between the cooling plate and the heating plate by the pressure of a gas. A heating device 2 includes a cooling plate 3 provided with flotation gas spouting ports 3a, and a heating plate provided with flotation gas spouting ports. The flotation gas spouting ports 3a and 3b are arranged along a wafer moving passage and are formed so as to spout the gas obliquely upward toward a first end of the wafer moving passage on the side of the cooling plate. A pushing member 51 is brought into contact with a back part of a wafer W with respect to a direction in which the wafer W is moved to move the wafer W in a direction toward the heating plate 6 opposite a direction in which the flotation gas is spouted. The pushing member 51 is brought into contact with a back part of a wafer W with respect to a direction in which the wafer W is moved to move the wafer W in a direction toward the cooling plate 3 in which the flotation gas is spouted.

19 Claims, 18 Drawing Sheets

U.S. PATENT DOCUMENTS

| | | | |
|---|---|---|---|
| 7,225,835 B2 * | 6/2007 | Vu | 137/884 |
| 7,351,293 B2 * | 4/2008 | Kuznetsov et al. | 118/730 |
| 2006/0222481 A1 * | 10/2006 | Foree | 414/800 |

FOREIGN PATENT DOCUMENTS

| | | |
|---|---|---|
| JP | 8-306681 | 11/1996 |
| JP | 2000-128345 | 5/2000 |
| JP | 2001-358206 | 12/2001 |

* cited by examiner

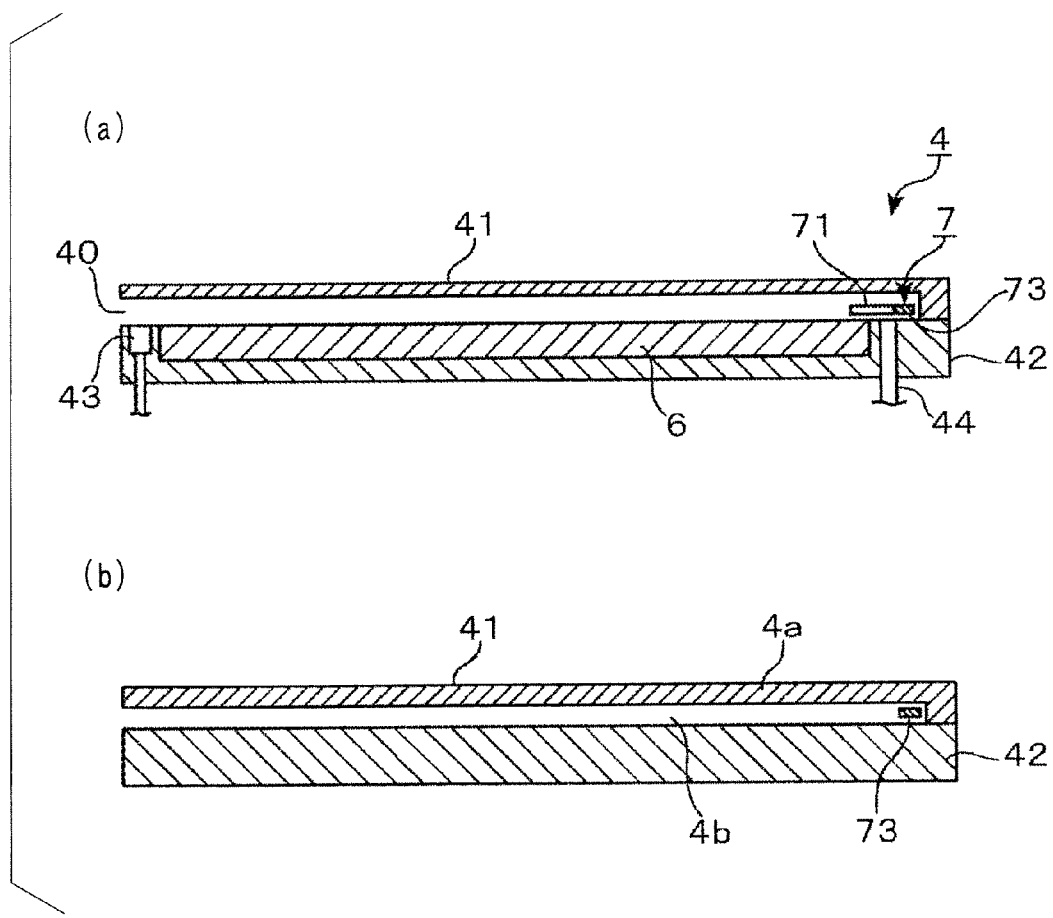
F I G . 1 3

HEATING DEVICE AND HEATING METHOD

BACKGROUND OF THE INVENTION

1. Field of the Invention

The present invention relates to a heating device for and a heating method of processing a substrate coated with a coating liquid by a heating process.

2. Description of the Related Art

A coating and developing system, which applies a resist to a semiconductor wafer (hereinafter, referred to as "wafer") and processes the wafer processed by an exposure process by a developing process, is used as a resist pattern forming system for forming a resist pattern on a wafer or a glass substrate for a LCD (liquid crystal display). The coating and developing system includes a heating device called a baking device. A heating device for heating, for example, a wafer coated with a liquid resist film dries the liquid resist film by removing a solvent contained in the liquid resist film.

The inventors of the present invention are making an effort to use a heating device, which covers a space extending over a heating plate for heating a wafer to form an air passage and generates a unidirectional air flow from an entrance opening at one end of the gas passage toward an exit opening at the other end of the gas passage, for carrying out a heating process. When such a unidirectional air flow is generated in the air passage, the adhesion of particles of sublimates sublimated from the liquid resist to a wafer W can be reduced.

FIG. 18 shows a heating device in which a unidirectional flow is generated. Shown in FIG. 18 are a box 10, an opening 10a through which a wafer is carried into and carried out of the box 10, and a shutter 10b for covering the opening 10a. Shown also in FIG. 18 are a base plate 11, a heating plate 12, and a cooling plate 13 capable of moving toward the heating plate 12 on the base plate 11 to cool a wafer W. A gas supply device 14 and a gas discharge device 15 are disposed on the base plate 11 at a position on the front side of the heating plate 12 and at a position on the rear side of the heating plate 12, respectively.

Lifting mechanisms 16 and 17 respectively for vertically moving pins 16a and 17a are disposed in a space under the base plate 11. The lifting mechanism 16 moves the pins 16a vertically to transfer a wafer W from an external carrying mechanism, not shown, advanced through the opening 10a into the box 10 to the cooling plate 13 and to transfer a wafer W from the cooling plate to the external carrying mechanism. The lifting mechanism 17 moves the pins 17a vertically to transfer a wafer W between the heating plate 12 and the cooling plate 13. A top plate 18 can be moved vertically by a lifting mechanism 18a.

A heating process to be carried out by this heating device will be described with reference to FIG. 19. As shown in FIG. 19(a), the heating plate 12 is covered with the top plate 18, the heating plate 12 is heated at a predetermined temperature, and a wafer W is delivered to the cooling plate 13. Then, as shown in FIG. 19(b), the top plate 18 is raised, the cooling plate 13 is advanced into a space extending between the top plate 18 and the heating plate 12, and then the wafer W is transferred from the cooling plate 13 to the heating plate 12. Then, as shown in FIG. 19(c), the cooling plate 13 is retracted to a position near the heating plate 12, and the top plate 18 is lowered near to the heating plate 12. In this state, the gas supply device 14 and the gas discharge device 15 are operated to generate a unidirectional gas flow from the gas supply device 14 toward the gas discharge device 15, and the wafer W is subjected to predetermined heating process. The top plate 18 is raised, and then the wafer W processed by the heating process is transferred from the heating plate 12 to the cooling plate 13. Subsequently, the wafer W is transferred from the cooling plate 13 to a carrying means, not shown, and then the carrying means carries the wafer W to the next process.

A resist pattern forming system provided with heating devices like this heating device requires the heating devices to be formed in a small thickness and to be stacked in layers to increase the throughput thereof. This heating device has a cooling mechanism including a cooling pipe embedded in the cooling plate 13 or attached to the lower surface of the cooling plate 13 to pass a cooling liquid through the cooling pipe. Therefore, the cooling plate 13 has a thickness on the order of 10 mm. Therefore, the thickness of a space extending between the heating plate 12 and the top plate 18 needs to be 10 mm or above taking into consideration the thickness of the cooling plate 13 and the thickness of a space necessary for transferring a wafer W to achieve transferring the wafer W between the heating plate 12 and the cooling plate 13. Consequently, it is difficult to form the heating device in a small thickness.

When the space extending between the heating plate 12 and the top plate 18 is thick, external air flows into the space between the heating plate 12 and the top plate 18 and disturbs the unidirectional air flow in the space. Consequently, the sublimates cannot be satisfactorily carried away from the space by the unidirectional air flow. Therefore, the top plate 18 is supported vertically movably, the top plate 18 is raised when the wafer W is transferred between the heating plate 12 and the cooling plate 13, and the top plate 18 is lowered to a predetermined position when the wafer W is processed by the heating process. However, when the top plate 18 is supported vertically movably, a space for installing the lifting mechanism and a space in which the top plate 18 is moved vertically are necessary, which obstructs reducing the thickness of the heating device.

In view of the foregoing problems, the inventors of the present invention are making studies of building a thin heating device by abandoning carrying a wafer W by the cooling plate 13 to reduce the vertical dimension of the space between the heating plate 12 and the top plate 18, abandoning vertically moving the top plate 18 and abandoning transferring a wafer W between the cooling plate 13 and the hot plate 12. A substrate carrying structure mentioned in Patent document 1 carries a substrate to a heating plate by keeping the substrate afloat by the pressure of a gas spouted through many small ports formed in the bottom wall of a structure defining a substrate carrying path without using plates and arms.

The structure mentioned in Patent document 1 spouts the gas in the moving direction of the substrate. Since any frictional force acts on the floating substrate, the substrate is unstable and is moved by a slight force. Therefore, the substrate is liable to drift longitudinally or transversely when the gas is spouted in the moving direction. Consequently, this known structure has difficulty in stabilizing and stably moving a wafer and in stopping the wafer W at a desired position. Thus this known structure is unpractical.

Patent document 1: JP-A 57-128940, p. 2, I. 2, upper right-hand col. to p. 2, I. 4, lower left-hand col.

SUMMARY OF THE INVENTION

The present invention has been made under the foregoing circumstances and it is therefore and object of the present invention to provide a thin heating device provided with a heating plate for heating a substrate, and a cooling plate for cooling the substrate, capable of floating the substrate above the cooling plate and the heating plate and of transversely moving the substrate by spouting a gas from the cooling plate and the heating plate to move the substrate between the cooling plate and the heating plate.

A heating device in a first aspect of the present invention includes: a processing vessel defining a flat heating chamber in which a substrate is subjected to a heating process and having an end wall provided with an opening through which the substrate is carried into and carried out of the heating chamber; a heating plate placed in the heating chamber; a cooling plate disposed contiguously with the end wall provided with the opening of the heating chamber to cool the substrate heated by the heating plate; flotation gas spouting ports, through which a gas is spouted obliquely upward toward either of opposite first and second ends of a substrate moving passage to float the substrate, formed in the cooling plate and the heating plate and arranged along the substrate moving passage; a pushing member for applying pushing force to a front or a rear end, with respect to a moving direction in which the substrate is moved, of the floated substrate when the substrate is moved; and a driving mechanism for driving the pushing member such that the pushing member applies pushing force to the substrate to move the substrate in a direction opposite a gas spouting direction in which the gas is spouted through the flotation gas spouting ports against force exerted by the gas on the substrate and such that the pushing member applies pushing force to the substrate to move the substrate in the gas spouting direction in which the gas is spouted through the flotation gas spouting ports to move the pushing member in the gas spouting direction in which the gas is spouted in a state where the substrate is pressed against the pushing member by the gas spouted through the flotation gas spouting ports.

Suppose, for example, that one end of the substrate moving passage on the side of the cooling plate is a first end and the other end of the same on the side of the heating plate is a second end. When the gas is spouted obliquely upward toward the first end through the flotation gas spouting ports, the substrate is moved from the cooling plate to the heating plate or from the heating plate to the cooling plate while the pushing member applies pushing force to a part of the substrate on the side of the first end of the substrate moving passage, i.e., on the side of the cooling plate. When the gas is spouted obliquely upward toward the second end through the flotation gas spouting ports, the substrate is moved from the cooling plate to the heating plate or from the heating plate to the cooling plate while the pushing member applies pushing force to a part of the substrate on the side of the second end of the substrate moving passage, i.e., on the side of the heating plate.

When the first end of the substrate moving passage is on the side of the cooling plate, the pushing member is disposed on the side of the second end of the cooling plate. The heating plate and the cooling plate may be provided with centering gas spouting ports arranged along the substrate moving passage on the opposite sides of the center line of the substrate moving passage and formed so as to spout the gas toward the center line to make the substrate float above the center line.

A heating device in a second aspect of the present invention includes: a processing vessel defining a flat heating chamber in which a substrate is subjected to a heating process and having an end wall provided with an opening through which the substrate is carried into and carried out of the heating chamber; a heating plate placed in the heating chamber; a cooling plate disposed contiguously with the end wall provided with the opening of the heating chamber to cool the substrate heated by the heating plate; forward flotation gas spouting ports, through which a gas is spouted obliquely upward toward a second end of a substrate moving passage opposite a first end of the substrate moving passage on the side of the cooling plate to float the substrate and to propel the substrate from the side of the cooling plate toward the heating chamber, formed in the cooling plate and the heating plate and arranged along the substrate moving passage; backward flotation gas spouting ports, through which a gas is spouted obliquely upward toward the first end of the substrate moving passage to float the substrate and to propel the substrate from the side of the heating chamber toward the cooling plate, formed in the cooling plate and the heating plate and arranged along the substrate moving passage; and centering gas spouting ports formed in the heating plate and the cooling plate, arranged along the substrate moving passage on the opposite sides of a center line of the substrate moving passage and formed so as to spout the gas toward a vertical plane containing the center line to make the substrate float above the center line.

The forward flotation gas spouting ports and the backward flotation gas spouting ports may be arranged on the same straight line extending along the substrate moving passage or may be arranged on different straight lines extending along the substrate moving passage, respectively. The flotation gas spouting ports through which the gas is spouted to float the substrate may serve also as centering gas spouting ports. The cooling plate and the heating plate may be provided with positioning members for stopping the substrate moved along the substrate moving passage at stopping positions.

A heating method to be carried out by a heating device provided with a heating plate for heating a substrate and a cooling plate for cooling the substrate, and designed to move the substrate between the heating plate and the cooling plate includes the steps of: placing a substrate on the cooling plate; spouting a flotation gas for floating the substrate obliquely upward toward a first end of a substrate moving passage or toward a second end opposite the first end of the substrate moving passage to float the substrate above the cooling plate; moving the substrate floating above the cooling plate toward the heating plate in a direction opposite a direction in which the flotation gas is spouted by applying pushing force to a back part of the substrate with respect to a direction in which the substrate is moved by a pushing member against pushing force exerted on the substrate by the flotation gas spouted through the flotation gas spouting ports or moving the substrate in the direction in which the flotation gas is spouted through the flotation gas spouting ports by applying pushing force to front part of the substrate with respect to the moving direction of the substrate by moving the pushing member in the direction in which the flotation gas is spouted; subjecting the substrate to a heating process by stopping spouting the flotation gas through the flotation gas spouting ports of the heating plate to place the substrate on the heating plate; floating the substrate above the heating plate by spouting the flotation gas through the flotation gas spouting ports of the cooling plate and the heating plate obliquely upward toward the first or the second end of the substrate moving passage; and moving the substrate toward the cooling plate by moving the substrate in a direction in which the flotation gas is spouted by applying pushing force to the front part of the substrate with respect to a direction in which the substrate is moved by the pushing member or by moving the substrate in a direction opposite a direction in which the flotation gas is spouted through the flotation gas spouting ports by applying pushing force to the back of the substrate with respect to the moving direction of the substrate against pushing force exerted on the substrate by the flotation gas spouted through the flotation gas spouting ports.

As mentioned above, the present invention floats the substrate above the cooling plate and the heating plate, carries the substrate longitudinally or horizontally into the flat heating chamber, and subjects the substrate to the heating process. Therefore, the heating chamber is not provided with a vertically movable cover and any operation for transferring the substrate to the heating plate is not necessary. Thus mechanisms for vertically moving the cover and for transferring the substrate to the heating plate, and a vertical space for the operation of the mechanisms are unnecessary, and the thickness of the heating device can be reduced accordingly.

The pushing mechanism for applying pushing force to the front or the back part of the substrate when the substrate is moved between the cooling plate and the heating plate applies pushing force to the back part of the substrate with respect to a direction in which the substrate is moved by the pushing member against pushing force exerted on the substrate by the flotation gas spouted through the flotation gas spouting ports or applies pushing force to the front part of the substrate with respect to the moving direction of the substrate by moving the pushing member in the direction in which the flotation gas is spouted. Thus pushing force of either the gas or the pushing mechanism is applied to the front and the rear end of the substrate when the substrate is moved. Therefore, the longitudinal displacement of the substrate in the moving direction can be prevented and the movement of the substrate can be stabilized.

The gas spouted through the centering gas spouting ports exerts pushing force so as to center the substrate with respect to the center line of the substrate moving passage. Thus the transverse displacement of the substrate during movement can be prevented and the movement of the substrate can be further stabilized.

BRIEF DESCRIPTION OF THE DRAWINGS

FIGS. 13(a) and 13(b) are sectional views of heating chamber included in the heating device shown in FIG. 11;

DESCRIPTION OF THE PREFERRED EMBODIMENTS

Figure 1:
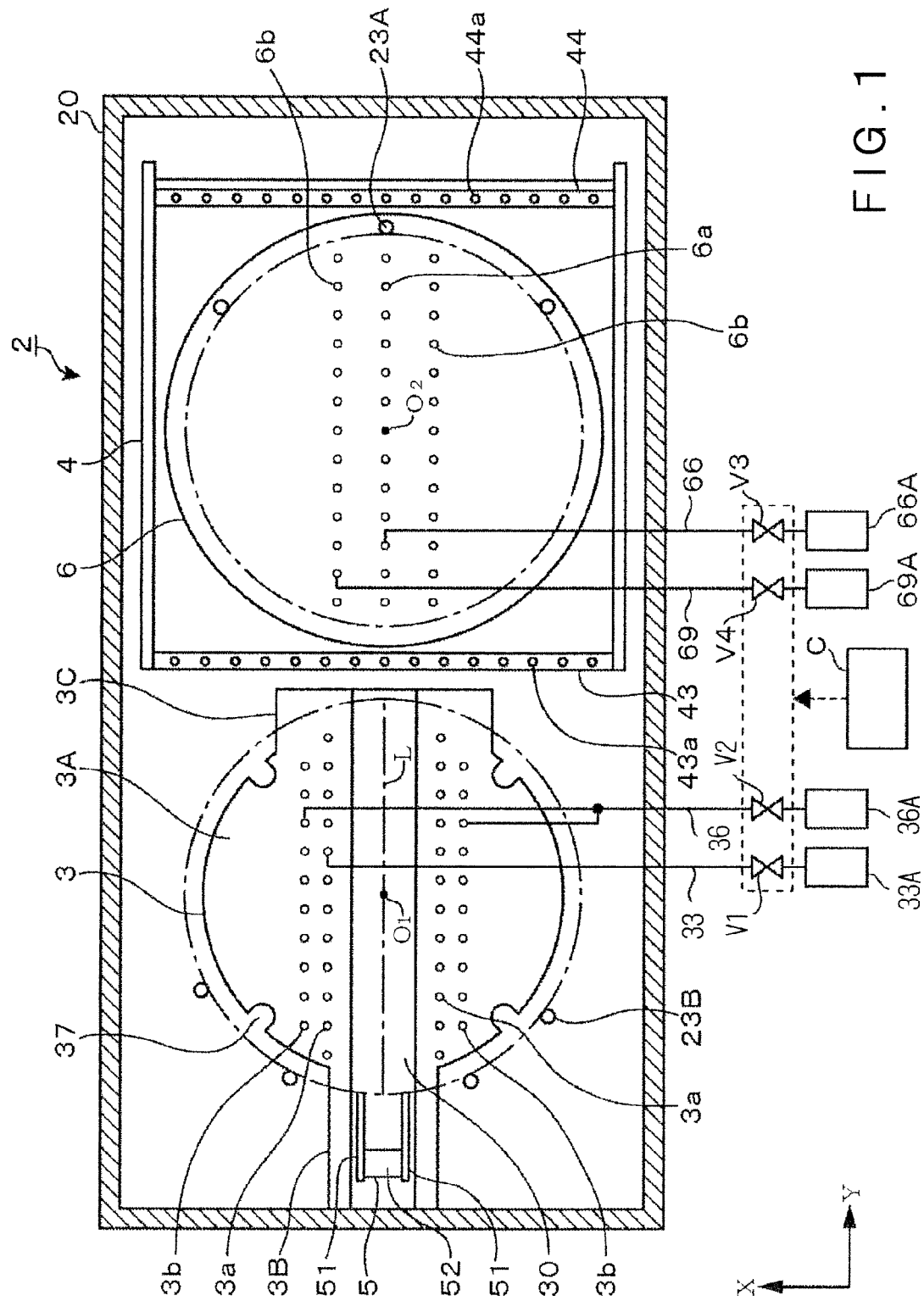
FIG. 1 is a plan view of a heating device in a first embodiment according to the present invention.
Figure 2:
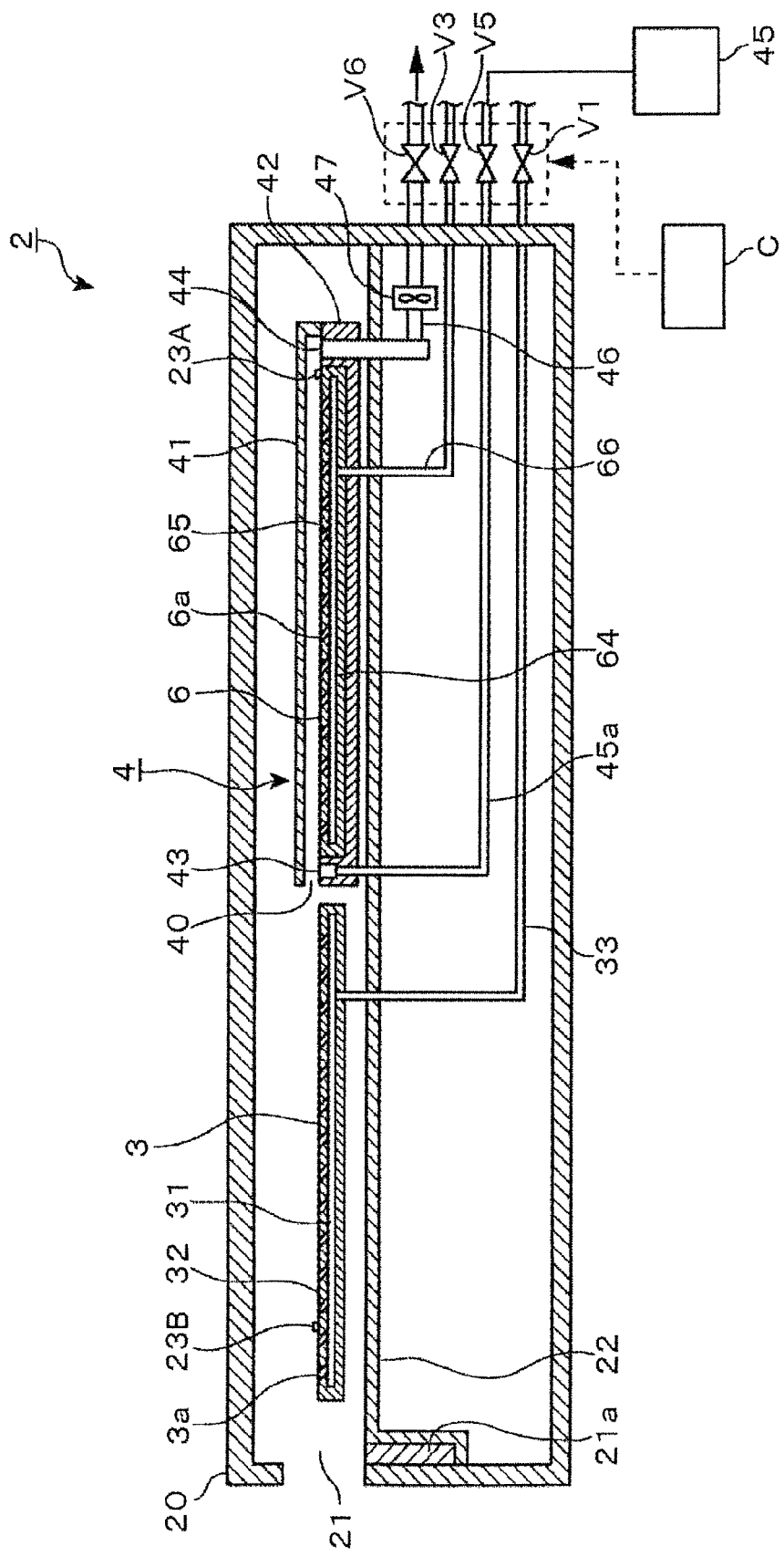
FIG. 2 is a longitudinal sectional view of the heating device in the preferred embodiment.
Figure 3:
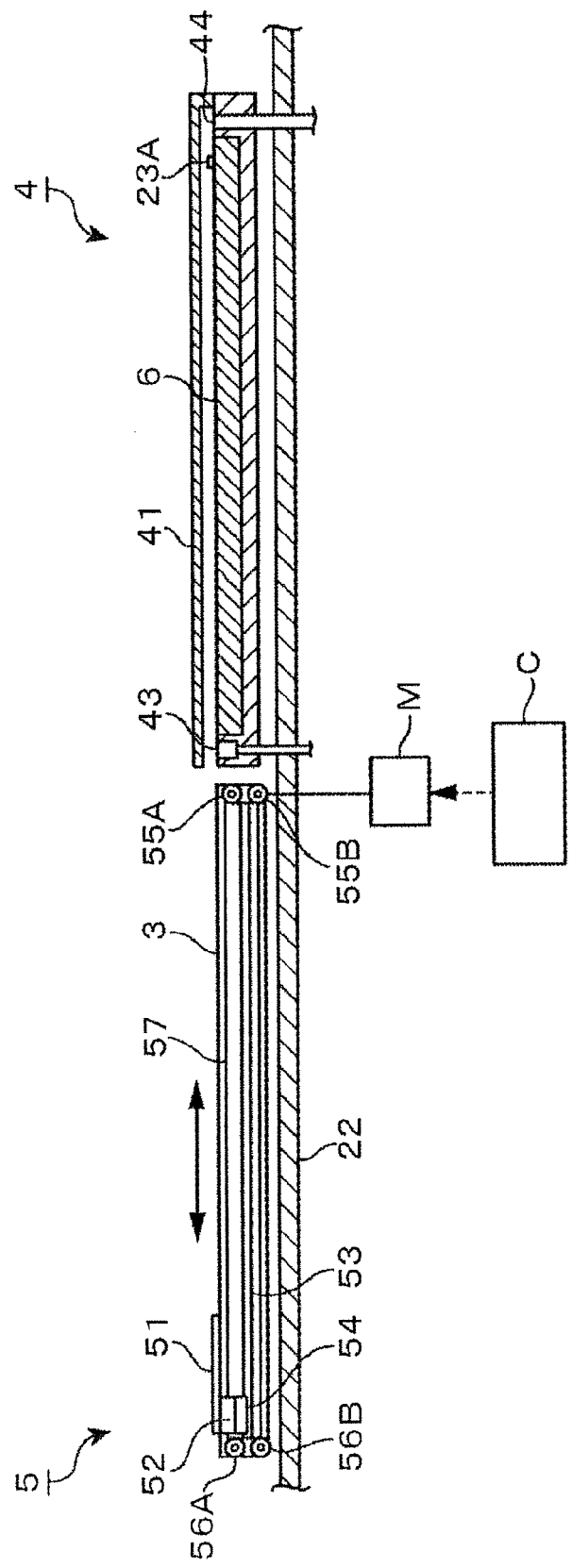
FIG. 3 is a longitudinal sectional view of the heating device in the preferred embodiment.

A heating device 2 in a preferred embodiment according to the present invention will be described with reference to the accompanying drawings as applied to forming a resist film on a surface of a wafer W, namely, a substrate, by processing the wafer coated with a liquid resist film by a heating process. The wafer W is, for example, a 12 in. wafer. Referring to FIGS. 1 and 2, the drying device 2 has a box 20 serving as a processing vessel. The box 20 has an end wall provided with an opening 21 through which the wafer W is carried into and carried out of the box 20. The opening 21 is covered with a shutter 21a. The shutter 21a prevents the disturbance of air flows around the wafer W by external air flowed through the opening 21 into the box 20 while the wafer W is being heated. An air curtain may be formed near the opening 21 instead of disposing the shutter near the opening 21 to exclude external air.

A base 22 is disposed in a lower part of the interior of the box 20. A side near the opening 21 will be referred to as a first side and a side apart from the opening 21 will be referred to as a second side. A cooling plate 3 for cooling the wafer W is disposed on a part of the base 22 on the first side. A flat heating chamber 4 for processing the wafer W by a heating process is disposed on a part of the base 22 on the second side. An end wall of the heating chamber 4 on the side of the cooling plate 3 is provided with an opening 40 through which the wafer W is carried into and carried out of the heating chamber 4. The wafer W is moved along a wafer moving passage between a position above the cooling plate 3 and the interior of the heating chamber 4. The wafer W is processed by the heating process in the heating chamber 4. An end of the wafer moving passage near the cooling plate 3 will be referred to as a first end, and the other end of the wafer moving passage on the side of the heating chamber 4 will be referred to as a second end.

The cooling plate 3 is made of, for example, aluminum. As shown in FIG. 1, the cooling plate 3 has a circular disk 3A having a shape resembling a circle of a diameter substantially equal to or slightly smaller than the diameter of the wafer W, a rectangular back tongue 3B extending backward from the circular disk 3A parallel to a wafer moving direction Y, and a rectangular front tongue 3C extending forward from the circular disk 3A parallel to the wafer moving direction Y. Circular peripheries of the circular part are on the right and the left side of the wafer moving passage, respectively, as viewed from the side of the opening 21. The thickness of the cooling plate 3 is on the order of 4 mm. A cooling mechanism, not shown, is combined with the back surface of the cooling plate 3. For example, temperature-controlled water is passed through the cooling mechanism to cool roughly the wafer W mounted on the cooling plate 3.

A pushing mechanism 5 is disposed at a position substantially corresponding to the center of the cooling plate 3 so as to be movable along the wafer moving passage over the circular disk 3A and the tongues 3B and 3C. The pushing mechanism 5 engages with a peripheral part of the wafer W to push the wafer W. When the wafer W is floated and moved between the cooling plate 3 and the heating chamber 4, the pushing mechanism 5 engages with a back end of the wafer W on the first side when the wafer W is moved.

Referring to FIGS. 1, 3, 4 and 5, the pushing mechanism 5 has a support member 52, and two bar-shaped pushing members 51 extending from the support member 52. The pushing members 51 come into engagement with the back end of the floated wafer W to apply pushing force to the wafer W.

The pushing mechanism is movable along the wafer moving passage in a groove 30 formed in a middle part of the cooling plate 3 so as to extend across the circular disk 3A and the tongues 3B and 3C along the wafer moving passage. A guide rail 53, not shown in FIG. 1, is extended parallel to the wafer moving passage on the bottom surface of the groove 30. A guide member 54 attached to a lower part of the support member 52 moves along the guide rail 53. Two pulleys 55A and 55B are supported on a second end part of the guide rail 53 on the second side, and two pulleys 56A and 56B are supported on a first end part of the guide rail 53 on the first side. A timing belt 57 is wound round the four pulleys 55A, 55B, 56A and 56B and is connected to the support member 52. For example, the pulley 55B is a drive pulley and the other three pulleys 55A, 56A and 56B are driven pulleys. A motor M, namely, a driving means, drives the pulley 55B to move the pushing mechanism 5 together with the timing belt 57 along the wafer moving passage. The timing belt 57, the pulleys 55A, 55B, 56A and 56B, guide member 54 and the guide rail 53 constitute a driving mechanism for driving the pushing mechanism 5. A controller C controls the operation of the motor M.

Many flotation gas spouting ports 3a formed in the cooling plate 3 are arranged along the wafer moving passage on the opposite sides of the groove 30. A flotation gas is spouted obliquely upward toward the first side opposite the side of the heating chamber 4. The flotation gas spouting ports 3a are arranged in two rows extending at the same distance from the center line L of the wafer moving passage passing the center $O_1$ of the wafer W mounted on the cooling plate 3 and the center $O_2$ of the wafer W mounted on a heating plate 6 on the opposite sides, respectively, of the center line L at predetermined intervals.

Figure 5:
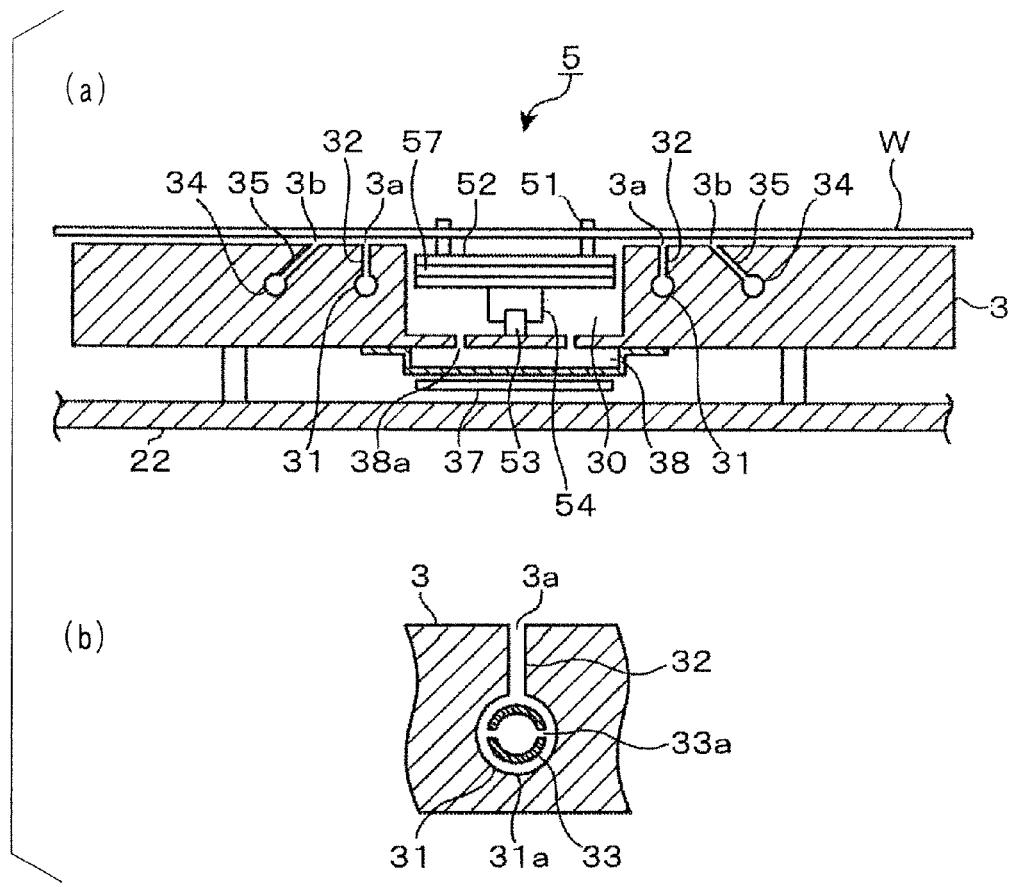
FIG. 5 is a sectional view of a cooling plate included in the heating device in the preferred embodiment taken from the side of a heating chamber.

As shown in FIGS. 2 and 5 by way of example, the flotation gas spouting ports 3a are connected to gas supply passages 31 formed in the cooling plate 3 so as to extend along the wafer moving passage by small connecting pores 32 formed in the cooling plate 3. The outer ends of the connecting pores 32 are the flotation gas spouting ports 3a. As shown in FIG. 2, the connecting pores 32 are formed so as to extend obliquely upward toward the first side and, consequently, the flotation gas is spouted obliquely upward toward the first end of the wafer moving passage.

As shown in FIG. 5(b) each of the gas supply passages 31 is formed by extending a gas supply pipe 33 in a cylindrical cavity 31a formed in the cooling plate 3 so as to extend along the wafer moving passage. Each of the connecting pores 32 has an inner end opening into the cylindrical cavity 31a and an outer end opening in the surface of the cooling plate 3. The gas supply pipe 33 is provided in its wall with pores 33a. A gas discharged through the pores 33a into the cylindrical cavity 31a flows through the connecting pores 32 and is spouted through the flotation gas spouting ports 3a.

Centering gas spouting ports 3b are formed in the cooling plate 3. The centering gas spouting ports 3b are arranged in two rows parallel to the wafer moving passage on the opposite sides of the center line L of the wafer moving passage on the outer side of the rows of the flotation gas spouting ports 3a. The gas is spouted through the centering gas spouting ports 3b toward a vertical plane containing the center line L to center the floating wafer W with respect to the wafer moving passage. The centering gas spouting ports 3b are arranged in two rows extending parallel to the wafer moving passage at the same distance from the center line L of the wafer moving passage on the outer sides of the rows of the flotation gas spouting ports 3a, respectively, at predetermined intervals.

The centering gas spouting ports 3b, similarly to the flotation gas spouting ports 3a, are connected to gas supply passages 34 formed in the cooling plate 3 so as to extend along the wafer moving passage by small connecting pores 35 formed in the cooling plate 3. The outer ends of the connecting pores 35 are the centering gas spouting ports 3b. The connecting pores 35 are formed so as to extend obliquely upward toward the vertical plane containing the center line L and, consequently, the centering gas is spouted obliquely upward toward the vertical plane containing the center line L. Each of the gas supply passages 34 is formed by extending a gas supply pipe 36 (FIG. 1) in a cylindrical cavity 34a, not shown, formed in the cooling plate 3 so as to extend along the wafer moving passage.

As shown in FIG. 1, radial notches 37 are formed in, for example, four peripheral parts of the cooling plate 3. The notches 37 are needed when the wafer W is transferred between an external carrying mechanism A and the cooling plate 3.

As shown in FIGS. 5 and 5(a) by way of example, exhaust pores 38a are formed in the cooling plate 3 so as to open in the bottom of the groove 30 in which the pushing mechanism 5 is placed. The exhaust pores 38a are arranged longitudinally at predetermined intervals. The gas discharged through the exhaust pores 38a is discharged outside through an exhaust chamber 38 formed under the groove 30 of the cooling plate 3 and surrounding an area in which the exhaust pores 38a are formed. For example, the gas spouted through the flotation gas spouting ports 3a and flowed through a space under the wafer W into the groove 30 is discharged through the exhaust pores 38a.

The wafer W is subjected to a heating process in the heating chamber 4. The heating chamber 4 defines an interior space large enough to contain the wafer W. The heating chamber 4 is provided with the heating plate 6 having the shape of a disk of a size substantially equal to that of the wafer W, and a top plate 41 disposed opposite to the heating plate 6. For example, the heating plate 6 is made of aluminum nitride (AlN) or silicon carbide (SiC), and the top plate 41 has a thickness on the order of 3 mm and is made of a heat-conducting material, such as aluminum (Al) or a stainless steel.

Figure 7:
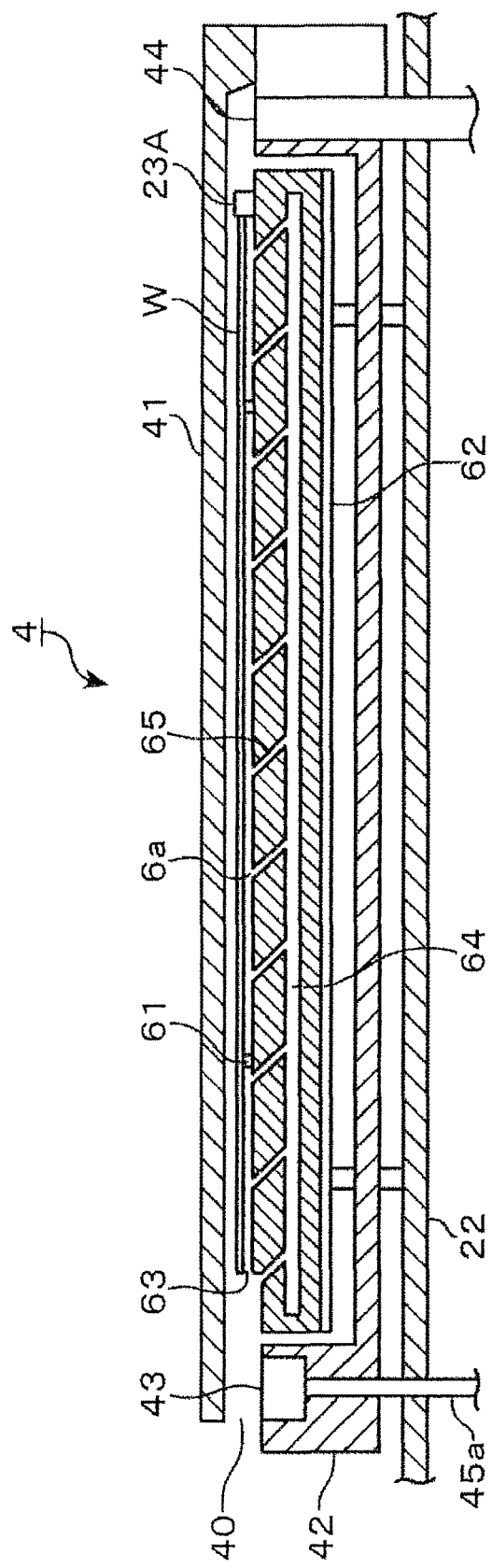
FIG. 7 is a sectional view of the heating chamber of the heating device in the preferred embodiment.

As shown in FIGS. 2 and 7, the heating plate 6 is held in a central recess formed in a lower vessel 42. The respective upper surfaces of the heating plate 6 and the lower vessel 42 are flush with each other. The top plate 41 has side walls extending on the opposite sides, respectively, of the heating plate 6 and an end wall on the second side of the heating plate 6 as viewed from the side of the cooling plate 3. The shape of a section parallel to the wafer moving passage of the top plate is U-shaped. The top plate 41 is put on the lower vessel 42 so as to define the opening 40. The height of the opening 40 is not greater than 6 mm. The top plate 41 defines a flat space.

Figure 4:
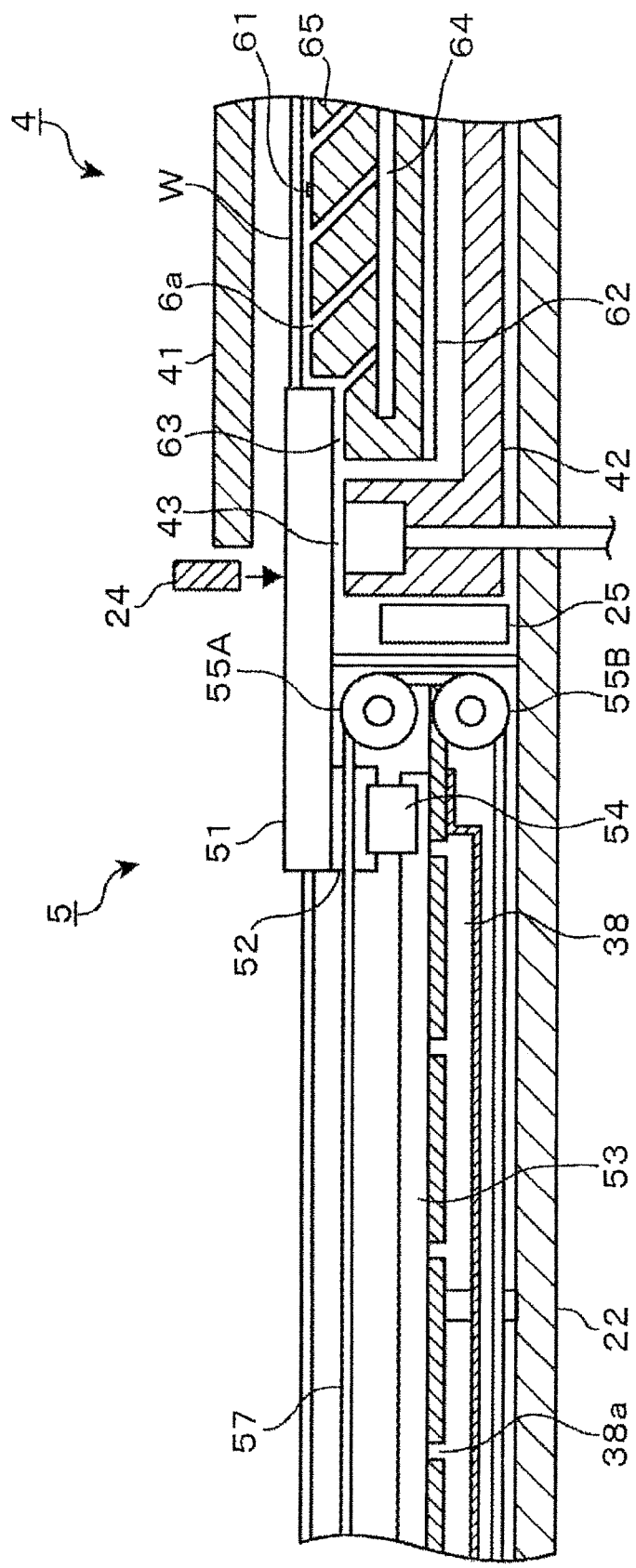
FIG. 4 is a longitudinal sectional view of a pushing mechanism included in the heating device in the preferred embodiment.
Figure 6:
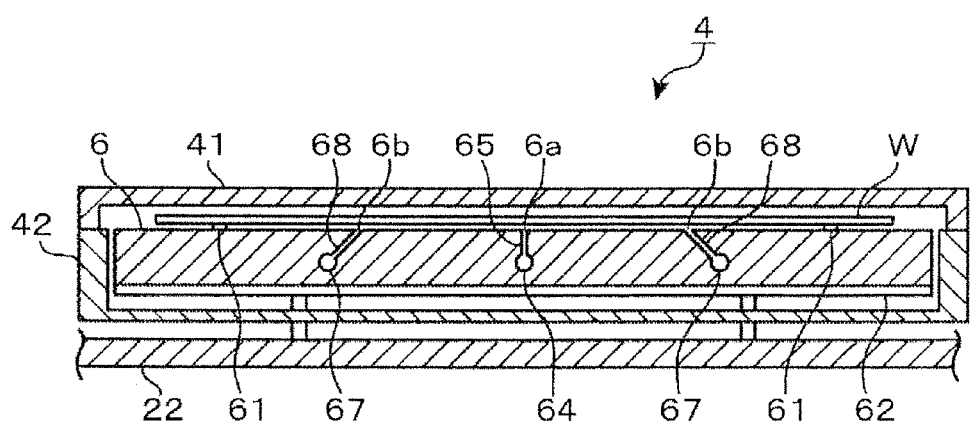
FIG. 6 is a sectional view of a heating plate included in the heating device in the preferred embodiment taken from the side of the cooling plate.

As shown in FIG. 1, the heating plate 6 is, for example, a disk of aluminum nitride having a diameter greater than that of the wafer W and a thickness on the order of 4 mm. Projections 61 are projected from the upper surface of the heating plate 6 to support the wafer W thereon at a height on the order of 0.2 mm from the upper surface of the heating plate 6. As shown in FIGS. 4, 6 and 7 by way of example, a heating means 62 including a heater is connected to the lower surface of the heating plate 6 to heat the wafer W mounted on the heating plate 6.

As shown in FIGS. 4 and 7 by way of example, a recess 63 is formed in a part of the heating plate 6 near the cooling plate 3 to receive an end part of the pushing member 51 of the pushing mechanism 5 when the wafer W is moved from the cooling plate 3 to a predetermined position on the heating plate 6 with the wafer W pushed by the pushing mechanism 5.

The heating plate 6 is provided with many flotation gas spouting ports 6a arranged along the wafer moving passage. The gas to float up the wafer W is spouted through the flotation gas spouting ports 6a obliquely upward toward the first sides, i.e., the side of the cooling plate 3. The flotation gas spouting ports 6a are arranged at predetermined intervals, for example, on the center line L of the wafer moving passage.

The flotation gas spouting ports 6a connected to a gas supply passage 64 formed along the wafer moving passage in, for example, the heating plate 6 by small connecting pores 65. The outer end of each of the connecting pores 65 is the flotation gas spouting port 6a. As shown in FIGS. 2 and 7, the connecting pores 65 are extended obliquely upward so as to incline toward the first side of the wafer moving passage, i.e., toward the cooling plate 3. Thus the gas is spouted through the flotation gas spouting ports 6a obliquely upward toward the first side of the wafer moving passage.

The gas supply passage 64 is formed, similarly to the gas supply passages 31, by extending a gas supply pipe 66 (FIGS. 1 and 2) in a cylindrical cavity, not shown, formed in the heating plate 6 so as to extend along the wafer moving passage. Each of the connecting pores 65 has an inner end opening into the cylindrical cavity and an outer end opening in the surface of the heating plate 6. The gas supply pipe 66 is provided in its wall with pores. A gas discharged through the pores into the cylindrical cavity flows through the connecting pores 65 and is spouted through the flotation gas spouting ports 6a.

Centering gas spouting ports 6b are formed in the heating plate 6. The centering gas spouting ports 6b are arranged in two rows parallel to the wafer moving passage on the opposite sides of the row of the flotation gas spouting ports 6a on the opposite sides of the row of the flotation gas spouting ports 6a. The gas is spouted through the centering gas spouting ports 6b toward a vertical plane containing the center line L to center the floating wafer W with respect to the wafer moving passage. The centering gas spouting ports 6b are arranged in two rows extending parallel to the wafer moving passage at the same distance from the center line L of the wafer moving passage on the outer sides of the row of the flotation gas spouting ports 6a, respectively, at predetermined intervals.

As shown in FIG. 6 by way of example, the centering gas spouting ports 6b are connected to gas supply passages 67 formed in the heating plate 6 so as to extend along the wafer moving passage by small connecting pores 68 formed in the heating plate 6. The outer ends of the connecting pores 68 are the centering gas spouting ports 6b. The connecting pores 68 are formed so as to extend obliquely upward and to be inclined toward the vertical plane containing the center line L of the wafer moving passage to spout the gas obliquely upward toward the vertical plane containing the center line L. The gas supply passage 67 is formed, similarly to the gas supply passage 64 for supplying the gas to the gas spouting pores 6a, by extending a gas supply pipe 69 (FIG. 1) in a cylindrical cavity, not shown, formed in the heating plate 6.

The gas to be spouted through the flotation gas spouting ports 3a and 6a and the centering gas spouting ports 3b and 6b is compressed air. Gas supply pipes 33, 36, 66 and 69 for carrying the gas, such as compressed air, into the gas supply passages 31, 34, 64 and 67 are connected through flow regulating valves V1, V2, V3 and V4 to gas sources 33A, 36A, 66A and 69A disposed outside the box 20 and storing the gas, such as compressed air, respectively. Only the gas supply pipes 33 and 66 are shown in FIG. 2 for convenience.

The lower vessel 42 is provided with a gas discharge device 43 near the opening 40 on the first side of the heating plate 6, and an exhaust device 44 on the second side of the heating plate 6. The gas discharge device 43 and the exhaust device 44 are on the front side and on the second side, respectively, of the wafer W placed in the heating chamber 4. The gas discharge device 43 and the exhaust device 44 have a width not shorter than the diameter of the wafer W. The gas discharge device 43 and the exhaust device 44 can generate a unidirectional flow of air in a direction from the opening 40 toward the depth of the heating chamber 4 in a space between the top plate 41 and the heating plate 6.

As shown in FIG. 1, the gas discharge device 43 is provided with many small discharge ports 43a arranged in a row at fixed intervals along the width of the heating chamber 4, i.e., in the X-direction as viewed in FIG. 1. The length of the row of the gas discharge ports 43a is not shorter than the diameter of the wafer W placed in the heating chamber 4. As shown in FIG. 2 by way of example, the discharge device 43 is connected to an inert gas source 45 containing clean purging gas, such as nitrogen gas, by a gas supply pipe 45a provided with a valve V5.

The gas heated by a heating means at a temperature equal to that of the wafer W, namely, the surface temperature of the heated wafer W, is discharged by the gas discharge device 43. The heating means may be a heater disposed near the outlet end of the gas supply pipe 45a or may be a heating device including a heat conducting plate extended in the gas discharge device 43 along the width of the gas discharge device 43 heat pipes each having one end connected to the heat conducting plate and the other end connecting a heating plate. The purging gas supplied from the inert gas source 45 through the gas supply pipe 45a into the gas discharge device 43 may be heated by the heat conducting plate at a temperature equal to that of the wafer W, namely, the surface temperature of the heated wafer W. The wafer W supported on the projections 61 in the heating chamber 4 is heated by the heating plate 6 and is heated beforehand at a process temperature by the heated purging gas flowing along the surface of the wafer W.

The exhaust device 44 is provided with many small exhaust ports 44a arranged in a row at fixed intervals along the width of the heating chamber 4. The length of the row of the exhaust ports 43a is not shorter than the diameter of the wafer W. The exhaust device 44 is connected to an exhaust system of the plant by an exhaust pipe 46 extending outside the box 20 and having one end connected to the exhaust device 44 and the other end connected to the exhaust system. A fan 47 is placed in the exhaust pipe 46. The operating speed of the fan 47 is controlled to discharge the gas from the heating chamber 4 through the exhaust ports 44a of the exhaust device 44 at a predetermined discharge rate. A valve V6 is placed in the exhaust pipe 46.

The foregoing construction of the gas discharge device 43 and the exhaust device 44 is not limitative, and the gas discharge device 43 and the exhaust device 44 may be built in any suitable construction, provided that the gas discharge device 43 and the exhaust device 44 can generate a unidirectional flow of air as mentioned above. The gas discharge device 43 and the exhaust device 44 may be provided with widthwise slits instead of the discharge ports 53a and the exhaust ports 44a, respectively.

The heating device is provided with positioning members 23A for stopping the wafer W at a predetermined position above the heating plate 6 and positioning the wafer W on the heating plate 6. The positioning members 23A are projections are arranged on a circle so that edge parts of the edge of the wafer W on the second side comes into contact with the positioning members 23A when the wafer W is positioned at a predetermined position on the heating plate 6.

The heating device is provided with positioning members 23B for stopping and positioning the wafer W moved from the heating plate 6 to the cooling plate 3 at a predetermined position. The positioning members 23B are, for example, projections arranged on a circle and projecting from the upper surface of the cooling plate 3 such that parts of the edge of the floating wafer W on the first side can come into contact with the projections and parts of the edge of the wafer W on the first side can come into contact with the projections when the wafer W is positioned at a predetermined position on the cooling plate 3.

A shutter 24 shown in FIG. 4 covers the opening 40 of the heating chamber 4 when the wafer W is processed by the heating process in the heating chamber 4. An air curtain may be formed near the opening 40 instead of disposing the shutter 24 near the opening 40. Indicated at 25 in FIG. 4 is an exhaust device attached to a side wall of the box 20.

Figure 8:
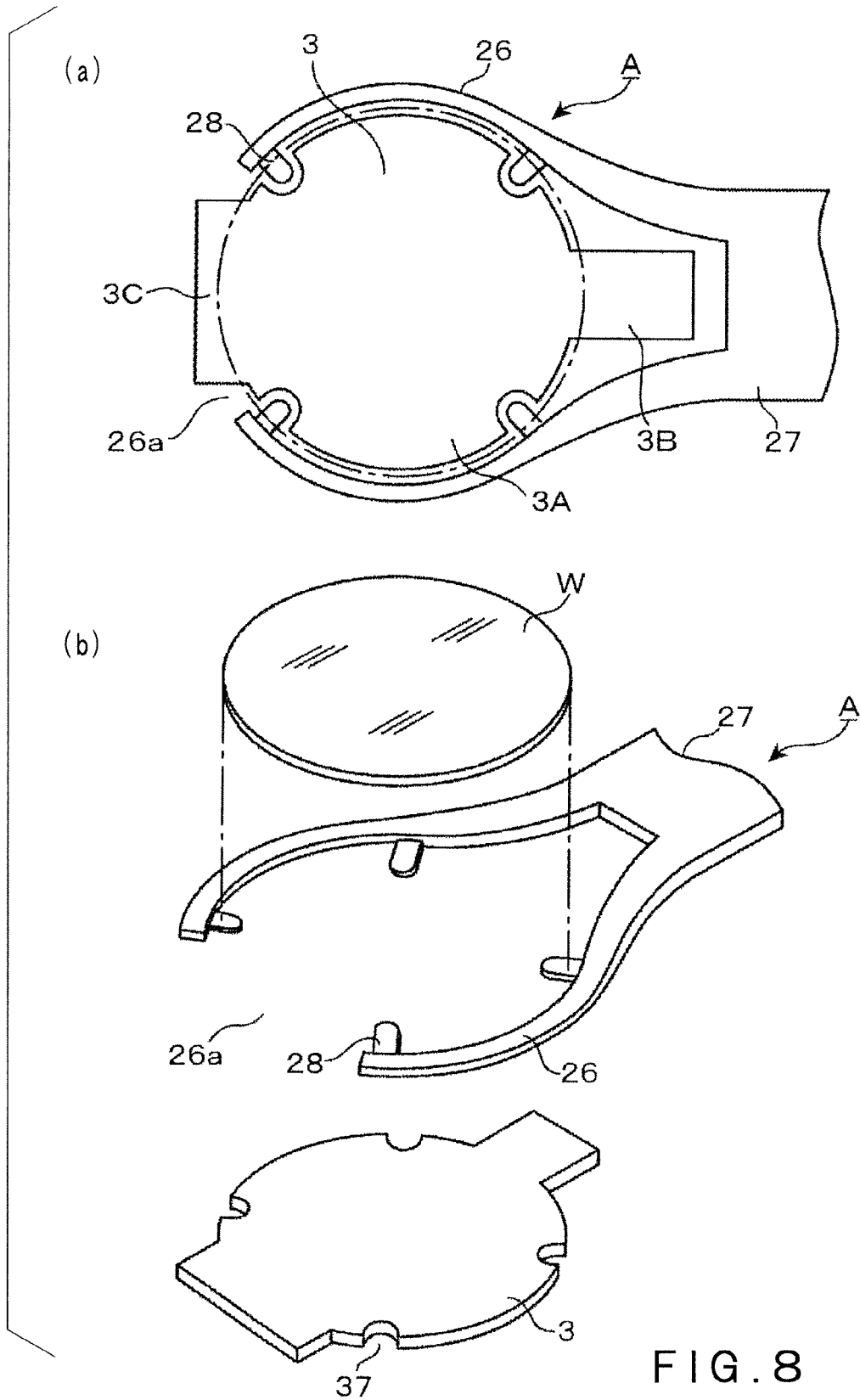
FIGS. 8(a) and 8(b) are a plan view and a perspective view, respectively, of an external carrying mechanism for carrying a wafer to the heating device and the cooling plate included in the heating device in the preferred embodiment.

The external carrying mechanism A for carrying the wafer W to and carrying the wafer W away from the cooling plate 3 will be described. Referring to FIG. 8, the carrying mechanism A has, for example, a horizontal, U-shaped carrying member 26 and a base member 27. A gap 26a between the free ends of the arms of the carrying member 26 is greater than the rectangular front tongue 3C. The diameter of a circle inscribed in the carrying arm 26 is slightly greater than the diameter of the cooling plate 3. Four projections 28 projects radially inward from lower parts of the carrying arm 26. The wafer is supported on the projections 28 as shown in FIG. 8(b).

A driving mechanism, not shown, drives the base member 27 to move the carrying arm 26 vertically and longitudinally. When the wafer W is transferred to the cooling plate 3, the pushing mechanism 5 is positioned at a home position, namely, a position on the first side of the cooling plate 3, the carrying arm 26 holding the wafer W is advanced through the opening 21 to a position above the cooling plate 3 in the box 20. In this state, the notches 37 formed in the circumference of the cooling plate 3 correspond to the projections 28 of the carrying arm 26, respectively. The carrying arm 26 is lowered past the cooling plate 3 to a position in a space under the cooling plate 3 to transfer the wafer W from the carrying arm 26 to the cooling plate 3. After the wafer W has been transferred to the cooling plate 3, the carrying arm 26 is moved in the space between the cooling plate 3 and the base 22 toward the opening 21 and is moved away from the box 20.

The positional relation of the component members of the heating device 2 will be described. In this embodiment, the wafer W is floated up by the gas and the floated wafer W is moved from the position above the cooling plate 3 to a position above the heating plate 6. The cooling plate 3 and the heating plate 6 are installed with the respective upper surfaces thereof substantially flush with each other to enable the floated wafer W floated up above the cooling plate 3 can be moved to a position above the heating plate 6. The wafer W is moved at a level above that of the projections 61 of the heating plate 6. The wafer W is moved down to support the wafer W on the projections 61. The wafer W supported on the projections 61 is subjected to the heating process. In this embodiment, the floated wafer W can be moved in a horizontal plane at a height of about 0.3 mm from the surfaces of the cooling plate 3 and the heating plate 6.

The controller C of the heating device 2 will be described. The controller C is, for example, a computer provided with a program storage unit. Programs, namely, pieces of software, including sets of directions for accomplishing operations of the heating device 2, such as heating the wafer W and controlling the flow of the gas, are stored in the program storage unit. The controller C reads the program and controls the operations of the semiconductor device fabricating system. The programs are recorded in a storage medium, such as a hard disk, a compact disk or a magnetooptical disk, and the storage medium is held in the program storage unit.

The controller C of the heating device 2 controls the valves V1 to V6 for opening and closing, and the operation and operating speed of the motor M. The controller C controls the spouting rate at which the gas is spouted through the spouting ports 3a, 6a, 3b and 6b to control pushing force exerted on the wafer W by the gas and the centering of the wafer W. The operating speed of the motor M is controlled to control pushing force exerted on the wafer W by the pushing mechanism 5 (moving speed) and the rotating direction of the output shaft of the motor M is controlled to control the moving direction of the pushing mechanism 5.

Figure 9:
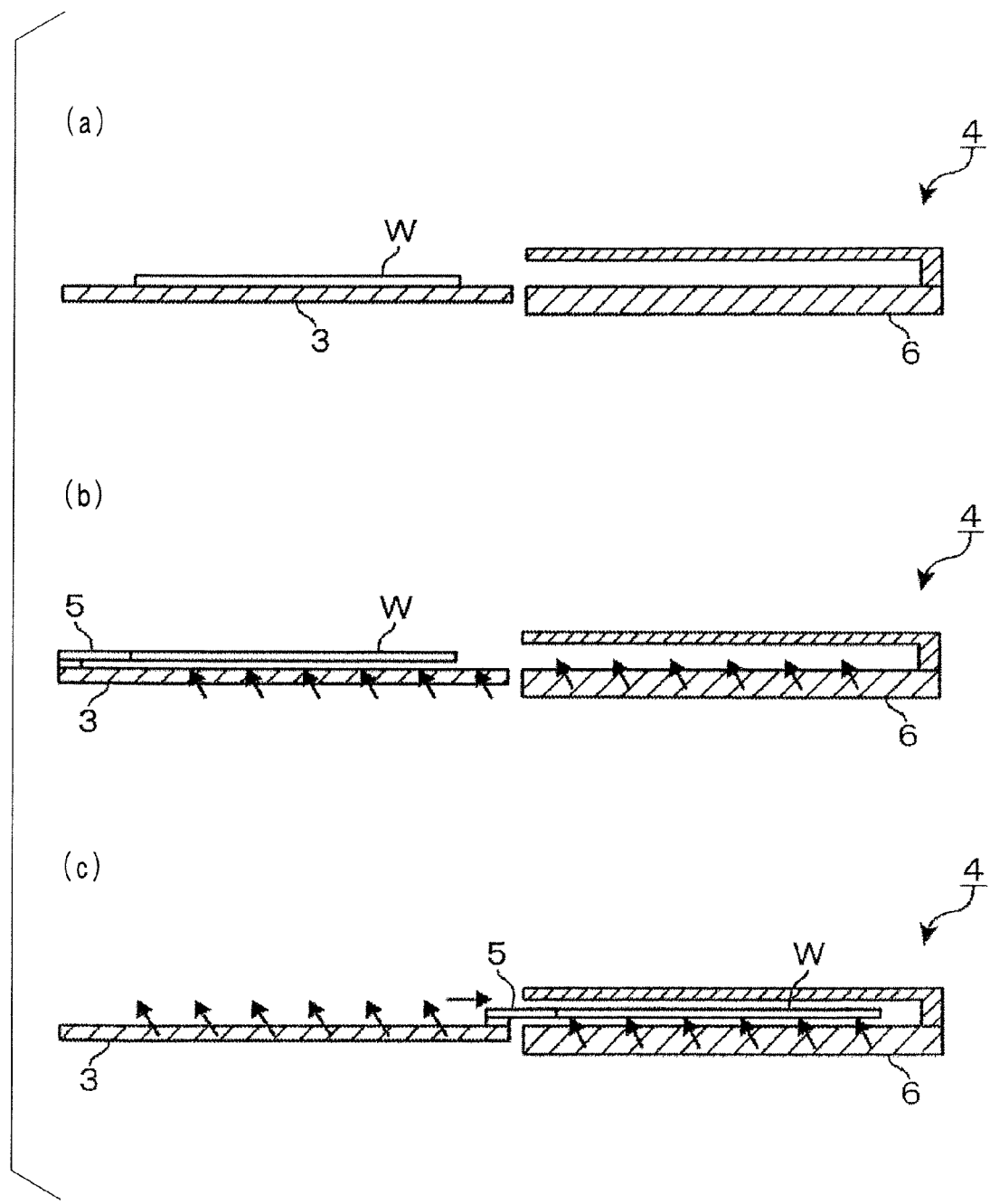
FIGS. 9(a), 9(b) and 9(c) are views of assistance in explaining the operation of the heating device in the preferred embodiment.

The operations of the heating device 2 will be described. The external carrying mechanism A carries a wafer W having a surface coated with a liquid resist film through the opening 21 into the box 20 and transfers the wafer W to the cooling plate 3 as shown in FIG. 9(a). Then, the valves V1 to V4 are opened to spout the gas through the flotation gas spouting ports 3a and 6a and the centering gas spouting ports 3b and 6b to float the wafer W at a height on the order of 0.3 mm from the surface of the cooling plate 3 as shown in FIG. 9(b). Then, the motor M is actuated to bring the pushing mechanism 5 into engagement with a back part, with respect to the moving direction of the wafer W, of the wafer W, i.e., a part of the wafer W on the first side opposite the side of the heating plate 6, to move the wafer W to a position above the heating plate 6 as shown in FIG. 9(c). Thus a front part, with respect to the moving direction of the wafer W, of the wafer W is pressed against the positioning members 23A.

The gas is spouted continuously obliquely upward toward the first side, i.e., toward the cooling plate 3, while the wafer W is being moved from the cooling plate 3 to the heating plate 6. Thus the gas exerts pushing force to push the wafer W toward the first end of the wafer moving passage on the wafer W. The pushing member 51 in engagement with the back part, with respect to the moving direction of the wafer W, of the wafer W pushes the wafer W toward the heating plate 6 against the pushing force of the gas.

Figure 10:
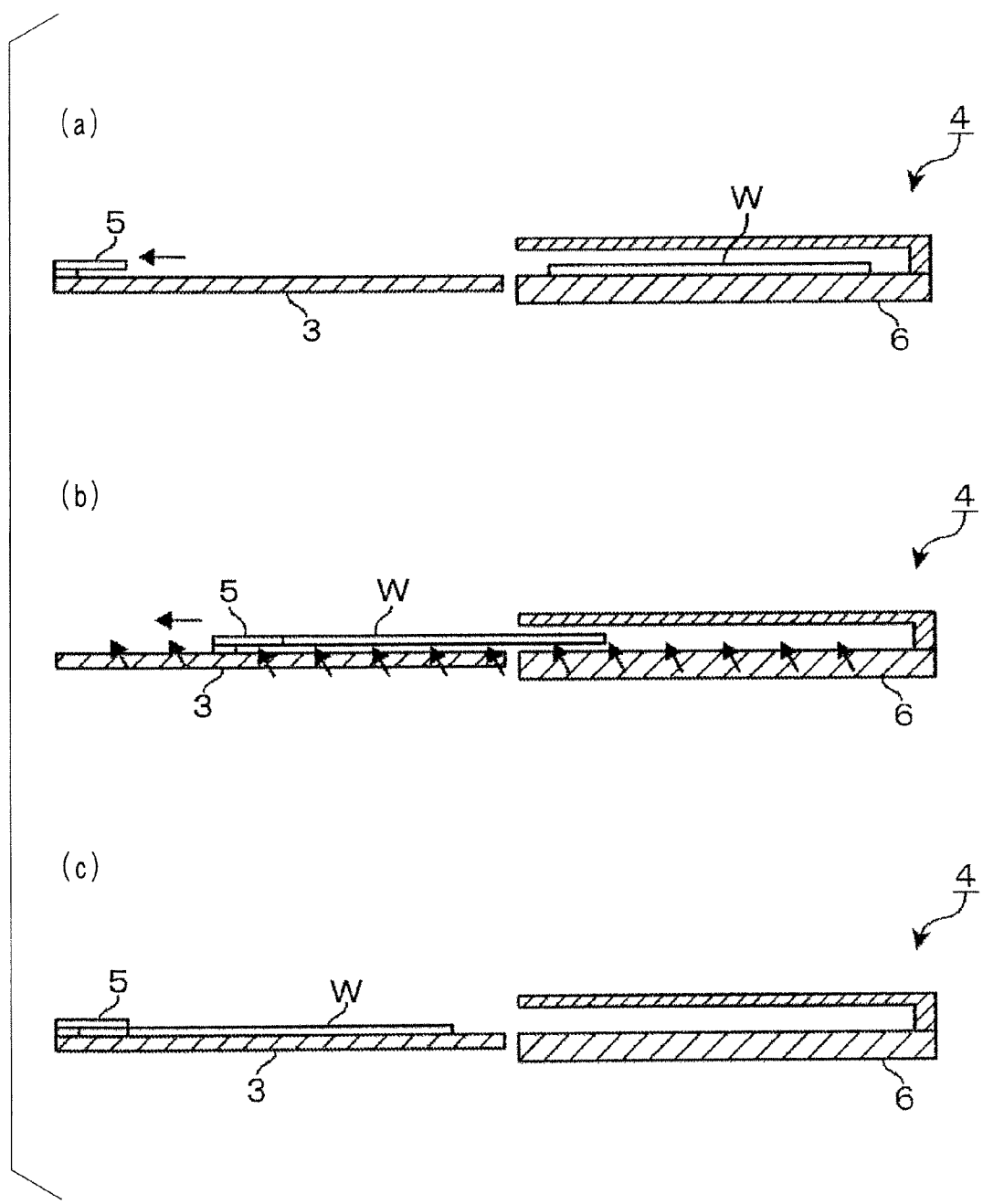
FIGS. 10(a), 10(b) and 10(c) are views of assistance in explaining the operation of the heating device in the first embodiment.

After front part, with respect to the moving direction of the wafer W, of the wafer W has been brought into contact with the positioning members 23A by the pushing mechanism 5, the valves V1 to V4 are closed to stop spouting the gas through the flotation gas spouting ports 3a and 6a and the centering gas spouting ports 3b and 6b, and the pushing mechanism 5 is retracted to its home position as shown in FIG. 10(a). Consequently, the wafer W kept floating above the heating plate 6 and positioned by the positioning members 23A is seated on the projections 61 of the heating plate 6. The interior of the heating chamber 4 is heated by the heating plate 6, for example, at a temperature on the order of 100° C. before the wafer W is carried into the heating chamber 4.

After the wafer W has been thus carried into the heating chamber 4, the valve V5 is opened to supply the purging gas of a predetermined temperature through the gas supply pipe 45a from the inert gas source 45 and to discharge the purging gas through the discharge ports 43a toward the top plate 41 of the heating chamber 4. At the same time, the valve V6 is opened and the fan 47 is actuated to exhaust the heating chamber 4 by the exhaust device 44. The purging gas discharged by the gas discharge device 43 into the heating chamber 4 flows through the space extending between the top plate 41 of the heating chamber 4 and the heating plate 6 and surrounding the wafer W from the first side toward the second side of the wafer moving passage. Then, the purging gas flows into the exhaust device 44 and is discharged from the heating chamber 4 and the box 20. Thus a unidirectional flow of the gas is generated around the wafer W. The liquid resist film coating the surface of the wafer W is heated and dried by heat radiated from the heating plate 6 and the unidirectional flow of the gas to form a resist film on the wafer W. After the purging gas has been supplied, for example, for a predetermined time so as to flow around the wafer W, the supply of the purging gas from the gas source 45 and the exhaustion of the heating chamber 4 by the exhaust device 44 are stopped.

Then, the valves V1 to V4 are opened to start spouting the gas through the flotation gas spouting ports 3a and 6a and the centering gas spouting ports 3b and 6b of the heating plate 6 and the cooling plate 3, and the pushing mechanism 5 is brought into engagement with a part of the wafer W on the first side of the wafer moving passage, i.e., on the side of the cooling plate 3.

The gas is spouted continuously obliquely upward toward the first side, i.e., toward the cooling plate 3, while the wafer W is being moved from the heating plate 6 to the cooling plate 3. Therefore, the gas exerts pushing force to push the wafer W toward the first end of the wafer moving passage on the wafer W. The pushing mechanism 5 is moved in the direction in which the gas is spouted, i.e., toward the cooling plate 3, with the pushing member 51 thereof pressed against a front part of the wafer W, i.e., a part on the side of the cooling plate 3. The pushing mechanism 5 is moved toward the first end of the wafer moving passage, i.e., toward the cooling plate 3, at a moving speed lower than a moving speed at which the wafer W may be moved toward the first end of the wafer moving passage by the pushing force of the gas unless the pushing member 51 is in engagement with the front part of the wafer W. Thus the front part of the wafer W with respect to the moving direction of the wafer w can be pressed against the pushing mechanism 5.

Thus, the wafer W is moved as shown in FIG. 10(b) by the cooperative action of the pushing force of the gas and the pushing mechanism 5 until the front part of the wafer W with respect to the moving direction comes into contact with the positioning members 23B of the cooling plate 6. Then, the valves V1 to V4 are closed to stop spouting the gas through the flotation gas spouting ports 3a and 6a and the centering gas spouting ports 3b and 6b as shown in FIG. 10(c). Consequently, the wafer W kept floating above the cooling plate 3 and positioned by the positioning members 23B is seated on the cooling plate 3.

The wafer W is supported on the cooling plate 3 with its lower surface in contact with the cooling plate 3. Thus the wafer W is cooled by the cooling plate 3 for rough cooling. After the completion of rough cooling, the wafer W is transferred from the cooling plate 3 to the external carrying mechanism A to carry the wafer W out of the box 20. The wafer W is transferred from the cooling plate 3 to the carrying mechanism A by reversing the operation for transferring the wafer W from the carrying mechanism A to the cooling plate 3. That is, for example, the carrying member 26 of the carrying mechanism A is advanced into the space extending between the lower surface of the cooling plate 3 supporting the wafer W and the base 22, the carrying member 26 is raided to a level above the cooling plate 3 to pick up the wafer W from the cooling plate 3 by the carrying member 26, and then the carrying member 26 supporting the wafer W above the cooling plate 3 is retracted.

The heating device 2 spouts the gas obliquely upward toward the first end of the wafer moving passage along which the wafer W is moved from the surfaces of the cooling plate 3 and the heating plate 6 to float the wafer W when the wafer W is carried between the cooling plate 3 and the heating plate 6, caries the wafer W into the flat heating chamber 4 by the cooperative action of the pushing force of the gas spouted from the surfaces of the cooling plate 3 and the heating plate 6, and processes the wafer W by the predetermined heating process.

When the wafer W is moved from the cooling plate 3 to the heating plate 6, the gas is spouted obliquely upward toward the first end of the wafer moving passage and presses the pushing mechanism 5 against the part of the wafer W on the first side. Thus the gas pushes the wafer W backward with respect to the moving direction to press the wafer W against the pushing mechanism 5 while the wafer W is being moved toward the second end of the wafer moving passage.

The gas pushes the wafer W backward with respect to the moving direction and the pushing mechanism 5 pushes the wafer W forward with respect to the moving direction while the wafer W is being moved from the cooling plate 3 to the heating plate 6. Therefore, the wafer W is restrained from free forward movement and free backward movement even though the wafer W is in an unstable floating state and the wafer W can be stably moved from the predetermined position to the predetermined position on the wafer moving passage.

The flow of the gas flowing from the heating plate 6 in a direction opposite the advancing direction is generated and the gas exerts the pushing force on the wafer W against the forward movement of the wafer W. Therefore, the wafer W can be stopped at a predetermined position above the heating plate 6 by removing the pushing force of the pushing mechanism 5 from the wafer W after the wafer W has arrived at a predetermined position.

Suppose that the gas is spouted from the cooling plate 3 and the heating plate 6 toward the second end of the wafer moving passage, i.e., in the moving direction of the wafer W, or the gas is spouted vertically upward from the cooling plate 3, and the pushing mechanism 5 applies pushing force to the end part of the wafer W to move the wafer W. Then, wafer W floats unstably above the cooling plate 3 without being restrained by any frictional force. Consequently, wafer W is liable to move unstably forward or obliquely forward when pushed by the pushing mechanism 5, the pushing mechanism 5 has difficulty in applying pushing force to a predetermined part of the wafer W and the wafer W is liable to be displaced from the wafer moving passage. It is inferred that it is difficult to move the wafer from the cooling plate 3 to the predetermined position on the heating plate 6 because it is difficult to move the wafer W stably.

When the wafer W is moved from the heating plate 6 to the cooling plate 3, the gas is spouted from the surfaces of the cooling plate 3 and the heating plate 6 toward the first end of the wafer moving passage, i.e., in the moving direction, to move the wafer W and to press the wafer W against the pushing member 51, and the pushing mechanism is moved in the direction in which the gas is spouted.

The front part, with respect to the moving direction, of the wafer W is pressed against the pushing mechanism 5 and the gas pushes the wafer W in the moving direction. Therefore, the wafer W is restrained from free forward and free backward movement by the opposite pushing forces and can be stably moved even though the wafer W is floating above the cooling plate 3 and the heating plate 6. The wafer W can be stopped at the predetermined position above the cooling plate 3 by stopping the pushing mechanism 5 at the predetermined position.

In this embodiment, the cooling plate 3 and the heating plate 6 are provided with the centering gas spouting ports 3b and 6b, respectively, to spout the gas toward the vertical plane containing the center line of the wafer moving passage when the wafer W is moved. Consequently, the wafer W is pushed by transverse forces from the opposite sides of the wafer moving passage so as to move along the center line of the wafer moving passage. Thus the wafer W can be centered and can be restrained from transverse displacement from the wafer moving passage.

The heating device 2 of the present invention does not use any cooling plate capable of carrying a wafer W or a special carrying means for carrying a wafer W to move the wafer W between the cooling plate 3 and the heating plate 6. Therefore, any operations for transferring the wafer W from the cooling plate to the heating plate 6 or for transferring the wafer W between the special carrying means and the heating plate 6 are not necessary. Usually, the transfer operations move either the cooling plate and the carrying means or the wafer W vertically in the heating chamber 4. Since such transfer operations are unnecessary, the any vertical clearance for the transfer operations does not need to be formed in the heating chamber 4.

Therefore, the heating chamber 4 needs to have a vertical size sufficient only to allow the wafer W floating above the heating plate 6 to move horizontally. Thus the heating chamber 4 can be formed in a considerably low height. Even if the height of the interior space of the flat heating chamber 4 is 3 mm or below, the top plate 41 of the heating chamber 4 does not need to be moved vertically.

The heating device 2 does not need any lifting mechanism for placing the wafer W on the heating plate 6 and any lifting mechanism for vertically moving the top plate 41. Since any spaces for the operation of the lifting mechanisms and any vertical clearance for lifting operations are not necessary and the heating chamber 4 is thin, the heating device 2 can be built in a low height. Since the heating device 2 can be formed in a thin structure, heating devices like the heating device 2 can be installed in layers in a coating and developing system. Thus a plurality of heating devices 2 can be installed in a floor space for a single heating device 2.

Time for vertically moving the top plate 41 relative to the heating plate 6 and for placing the wafer W on and carrying the wafer W away from the heating plate 6 is not necessary. Consequently, overhead time can be reduced and throughput can be improved accordingly. Since the top plate 41 of the heating chamber 4 is not vertically movable, a space for installing a lifting mechanism for vertically moving the top plate 41 and a vertical space for lifting operations are not necessary, and hence the heating device 2 can be built in a low height.

There is no possibility that the flow of the gas in the heating device 2 is disturbed by the vertical movement of the top plate 41, the flow of the gas in the heating device 2 is disturbed hardly, and hence the flow of the gas can be satisfactorily controlled. Thus the disturbance of the flow of the gas in the heating device 2 can be suppressed and the unidirectional flow of the gas can be generated. The stable unidirectional flow of the gas can effectively carry away the sublimates through the exhaust device 44 and the adhesion of the sublimates to the wafer W can be suppressed.

A heating device 2 in a second embodiment according to the present invention will be described with reference to FIGS. 11 to 13. The heating device 2 in the second embodiment differs from the heating device in the first embodiment in that a pushing mechanism 7 is installed on the side of a heating chamber 4, i.e., on the side of the second end of a wafer moving passage along which a wafer W is moved. Referring to FIG. 12, a cooling plate 3 and a heating plate 6 are placed on the wafer moving passage along which the wafer W is moved. The cooling plate 3 and the heating plate 6 are provided with flotation gas spouting ports 7a and 7b, respectively. The flotation gas spouting ports 7a and 7b are arranged in a row parallel to the center line of the wafer moving passage at predetermined intervals and are formed so as to spout a gas for floating the wafer W obliquely upward toward the second end of the wafer moving passage, i.e., toward the heating chamber 4.

The pushing mechanism 7 has a support member 72, and pushing members 71 supported by the support member 72 so as to extend toward the first end of the wafer moving passage. The pushing members 71 are brought into contact with a part, on the side of the second end of the wafer moving passage, of the wafer W. The pushing members 71 supported by the support member 72 can be moved over the heating plate 6 along the wafer moving passage along which the wafer w is moved.

Figure 11:
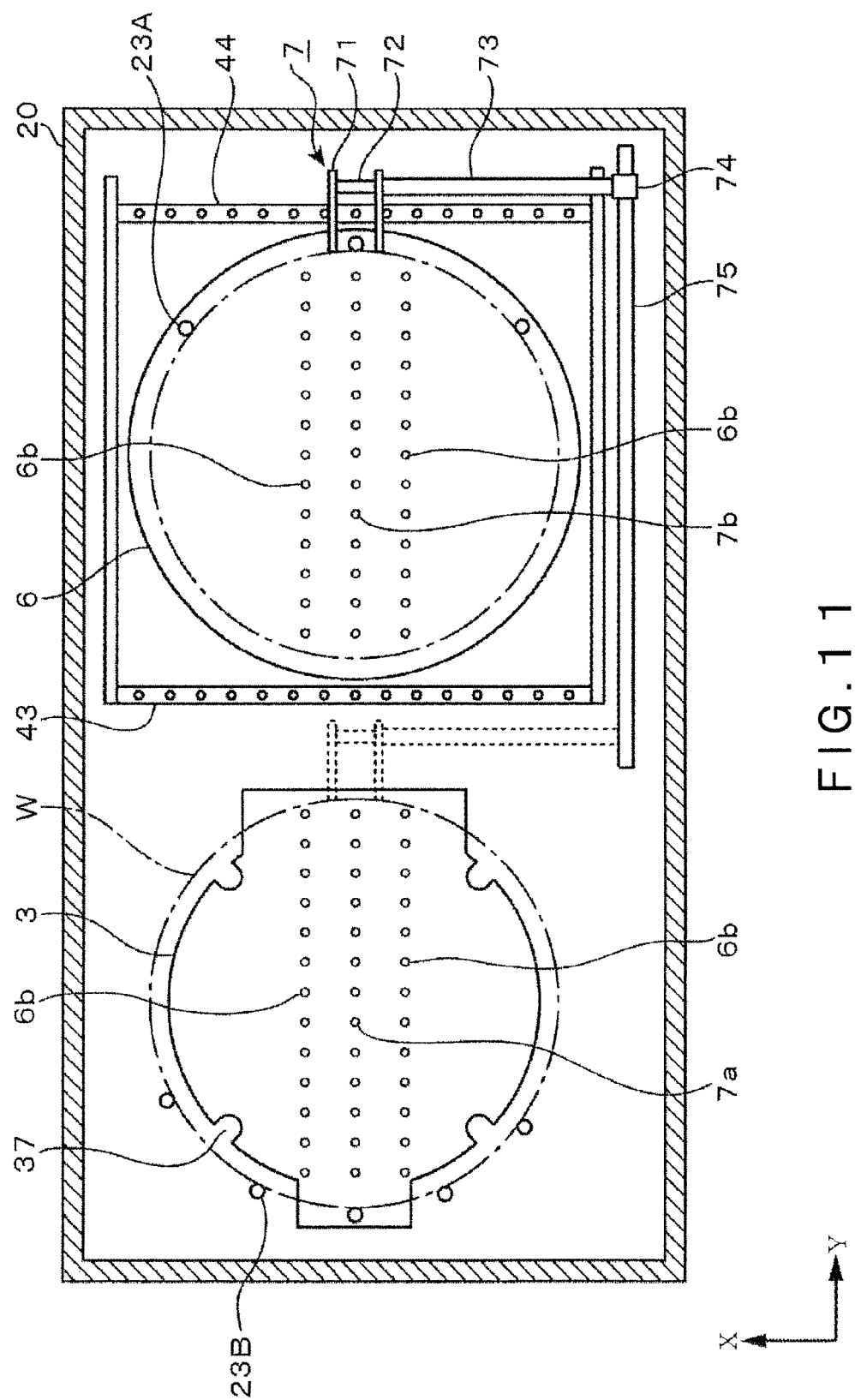
FIG. 11 is a plan view of a heating device in a first modification of the heating device in the preferred embodiment.
Figure 12:
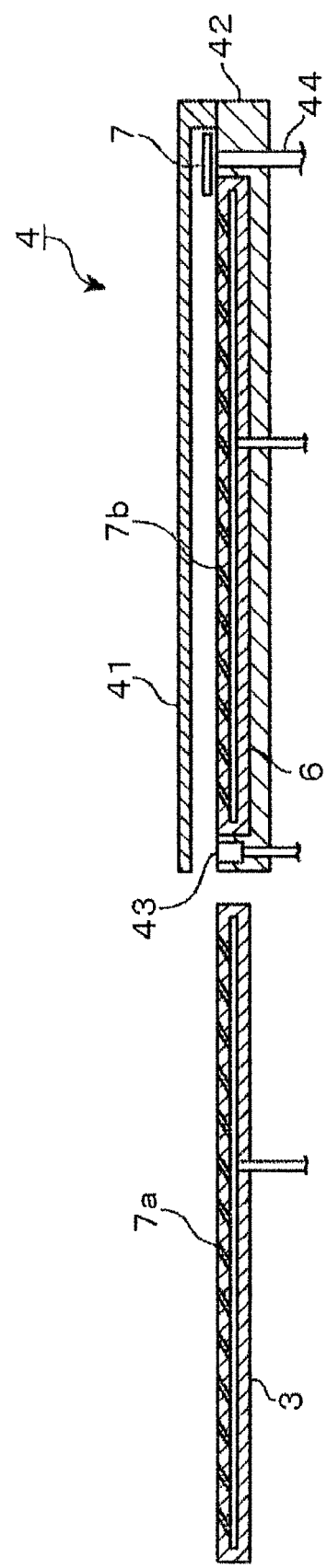
FIG. 12 is a longitudinal sectional view of the heating device shown in FIG. 11.

A support arm 73 having the shape of a thin plate extends along the width of the heating chamber 4, i.e., in the X-direction as viewed in FIG. 11 from a side surface of one of the pushing members 71. An end part of the support arm 73 projects outside through a side wall 4a of the heating chamber 4 from the heating chamber 4 and is connected to a holding member 74 that moves along a guide rail 75 extended outside the heating chamber 4 parallel to the wafer moving passage. The holding member 74 moves along the guide rail 75 parallel to the wafer moving passage to move the pushing members 71 along the wafer moving passage. The side wall 4a of the heating chamber 4 is provided with a slot 4b along which the support arm 73 can move. The heating device 2 in the second embodiment is similar to the heating device 2 shown in FIG. 1 in other respects.

When the wafer w is moved from the cooling plate 3 to the heating plate 6 in this heating device 2, the gas is spouted from the cooling plate 3 and the heating plate 6 to float the wafer W, and the pressing members 71 are brought into contact with a front part, with respect to a moving direction in which the wafer W is moved, of the wafer W floating above the cooling plate 3. The gas pushes the wafer W toward the heating plate 6, so that the wafer W is pressed against the pushing members 71. Then, the pushing mechanism 7 is moved in the direction in which the gas is spouted, i.e., toward the heating chamber 4, to move the wafer W to a position above the heating plate 6. Subsequently, the spouting the gas from the cooling plate 3 and the heating plate 6 is stopped to place the wafer W on the heating plate 6. Then, the wafer W is subjected to a predetermined heating process.

When the wafer w is moved from the heating plate 6 to the cooling plate 3, the gas is spouted from the cooling plate 3 and the heating plate 6 to float the wafer W, and the pressing members 71 are brought into contact with a back part, with respect to a moving direction in which the wafer W is moved, of the wafer W floating above the heating plate 6. The gas pushes the wafer W toward the heating plate 6, so that the wafer W is pressed against the pushing members 71. Then, the pushing mechanism 7 pushes the wafer W against the pushing force exerted on the wafer W by the gas to move the wafer W in a direction opposite the direction in which the gas is spouted, i.e., toward the cooling plate 3, to move the wafer W to a position above the cooling plate 3. Subsequently, the spouting the gas from the cooling plate 3 and the heating plate 6 is stopped to place the wafer W on the cooling plate 3. Then, the wafer W is subjected to a predetermined cooling process.

The wafer W is pushed from the opposite directions by the pushing force of the gas and that of the pushing mechanism 7 while the wafer W is being moved between the cooling plate 3 and the heating plate 6. Therefore, the wafer is restrained from free forward movement and free backward movement and the wafer W can be stably moved.

In the heating devices 2 respectively shown in FIGS. 1 and 11, the flotation gas spouting ports 3a, 6a, 7a and 7b formed in the cooling plate 3 and the heating plate 6 to float the wafer W may be arranged in at least one row extending along the wafer moving passage along which the wafer W is moved, and the centering gas spouting ports 3b and 6b for centering the wafer W may be arranged in a plurality of pairs of rows on the opposite sides, respectively, of the center line of the wafer moving passage along which the wafer W is moved.

Although the flotation gas spouting ports 3a, 6a and 7a and the centering gas spouting ports 3b and 6b are formed separately in the foregoing embodiments, the flotation gas spouting ports 3a, 6a and 7a may be formed such that the gas is spouted toward a vertical plane containing the center line L of the wafer moving passage and also obliquely upward toward the first or the second end of the wafer moving passage to use the flotation gas spouting ports 3a, 6a and 7a for both floating and centering the wafer W.

A heating device 2 in a third embodiment according to the present invention will be described with reference to FIGS. 14 and 15. The heating device 2 in the third embodiment differs from the foregoing heating devices 2 in that the heating device 2 is not provided with any pushing mechanism and floats and propels a wafer W by the pushing force of a gas spouted through gas spouting ports formed in a cooling plate 3 and a heating plate 6.

In this heating device 2, the cooling plate 3 and the heating plate 6 are provided with forward flotation gas spouting ports 76, through which the gas is spouted obliquely upward toward a second end of a wafer moving passage to float the wafer W and to propel the wafer W from the side of the cooling plate 3 toward a heating chamber 4, arranged along the wafer moving passage, and backward flotation gas spouting ports 77, through which the gas is spouted obliquely upward toward the first end of the wafer moving passage to float the wafer W and to propel the wafer W from the side of the heating chamber 4 toward the cooling plate 3, arranged along the wafer moving passage.

For example, the forward flotation gas spouting ports 76 and the backward flotation gas spouting ports 77 are arranged on the center line L of the wafer moving passage in the cooling plate 3 and the heating plate 6. In this embodiment, the forward flotation gas spouting ports 76 are formed on the first side of the center O1 of the wafer W on the cooling plate 3 and on the first side of the center O2 of the wafer W on the heating plate 6, and the backward flotation gas spouting ports 77 are formed on the second side of the center O1 of the wafer W on the cooling plate 3 and on the second side of the center O2 of the wafer W on the heating plate 6.

For example, the forward flotation gas spouting ports 76 of the cooling plate 3 are connected to a gas source 76b by a gas supply pipe 76a provided with a valve V7, the backward flotation gas spouting ports 77 of the cooling plate 3 are connected to a gas source 77b by a gas supply pipe 77a provided with a valve V8, the forward flotation gas spouting ports 76 of the heating plate 6 are connected to a gas source 76d by a gas supply pipe 76c provided with a valve V9, and the backward flotation gas spouting ports 77 of the heating plate 6 are connected to a gas source 77d by a gas supply pipe 77c provided with a valve V10. The groups of those flotation gas spouting ports are used independently for spouting the gas. The arrangement of centering gas spouting ports 3b and 6b for spouting the gas to center the wafer W while the wafer W is being moved and the other respects of this heating device 2 are similar to those of the heating device 2 shown in FIG. 1.

When the wafer W is moved forward from the cooling plate 3 to the heating plate 6, the gas is spouted through the forward flotation gas spouting ports 76 of the cooling plate 3 and the heating plate 6 to float the wafer W above the cooling plate 3 and to propel the wafer W toward the heating plate 6. The forward movement of the wafer W is stopped by positioning members 23A on the heating plate 6 and the wafer W is seated on the heating plate 6 by stopping the spouting of the gas through the forward flotation gas spouting ports 76.

When the wafer W is moved backward from the heating plate 6 to the cooling plate 3, the gas is spouted through the backward flotation gas spouting ports 77 of the cooling plate 3 and the heating plate 6 to float the wafer W above the heating plate 6 and to propel the wafer W toward the cooling plate 3. The backward movement of the wafer W is stopped by positioning members 23B on the cooling plate 3 and the wafer W is seated on the cooling plate 3 by stopping the spouting of the gas through the forward flotation gas spouting ports 77.

This heating device 2 is simple in construction and can be manufactured at a low manufacturing cost because the heating device 2 does not need any pushing mechanism. The heating device 2 can be built in a low height because the heating device 2 does not need to have a space for a pushing mechanism. Since any control operation for controlling a pushing mechanism is unnecessary when the wafer W is moved between the cooling plate 3 and the heating plate 6, a program for moving the wafer W is simple.

The forward flotation gas spouting ports 76 and the backward flotation gas spouting ports 77 may be arranged on a single straight line extending along the wafer moving passage or may be arranged on separate straight lines extending along the wafer moving passage.

When the wafer W is moved from the cooling plate 3 to the heating plate 6, the gas may be spouted through the backward flotation gas spouting ports 77 upon the entrance of a front part, with respect to the moving direction, of the wafer W into a space extending over the heating plate 6 to decelerate the wafer W. Similarly, when the wafer W is moved from the heating plate 6 to the cooling plate 3, the gas may be spouted through the forward flotation gas spouting ports 76 upon the entrance of a front part, with respect to the moving direction, of the wafer W into a space extending over the cooling plate 3 to decelerate the wafer W. The respective pushing forces of the gases respectively spouted through the forward flotation gas spouting ports 76 and the backward flotation gas spouting ports 77 may be controlled to regulate the moving speed of the wafer W and deceleration by controlling spouting rate at which the gas is spouted through the forward flotation gas spouting ports 76 and the backward flotation gas spouting ports 77.

The forward flotation gas spouting ports 76 and the backward flotation gas spouting ports 77 may be formed so as to spout the gas obliquely upward toward the first or the second end of the wafer moving passage and so as to spout the gas toward a vertical plane containing the center line L of the wafer moving passage from the opposite sides of the center line L of the wafer moving passage to use the forward flotation gas spouting ports 76 and the backward flotation gas spouting ports 77 also as centering gas spouting ports.

Figure 14:
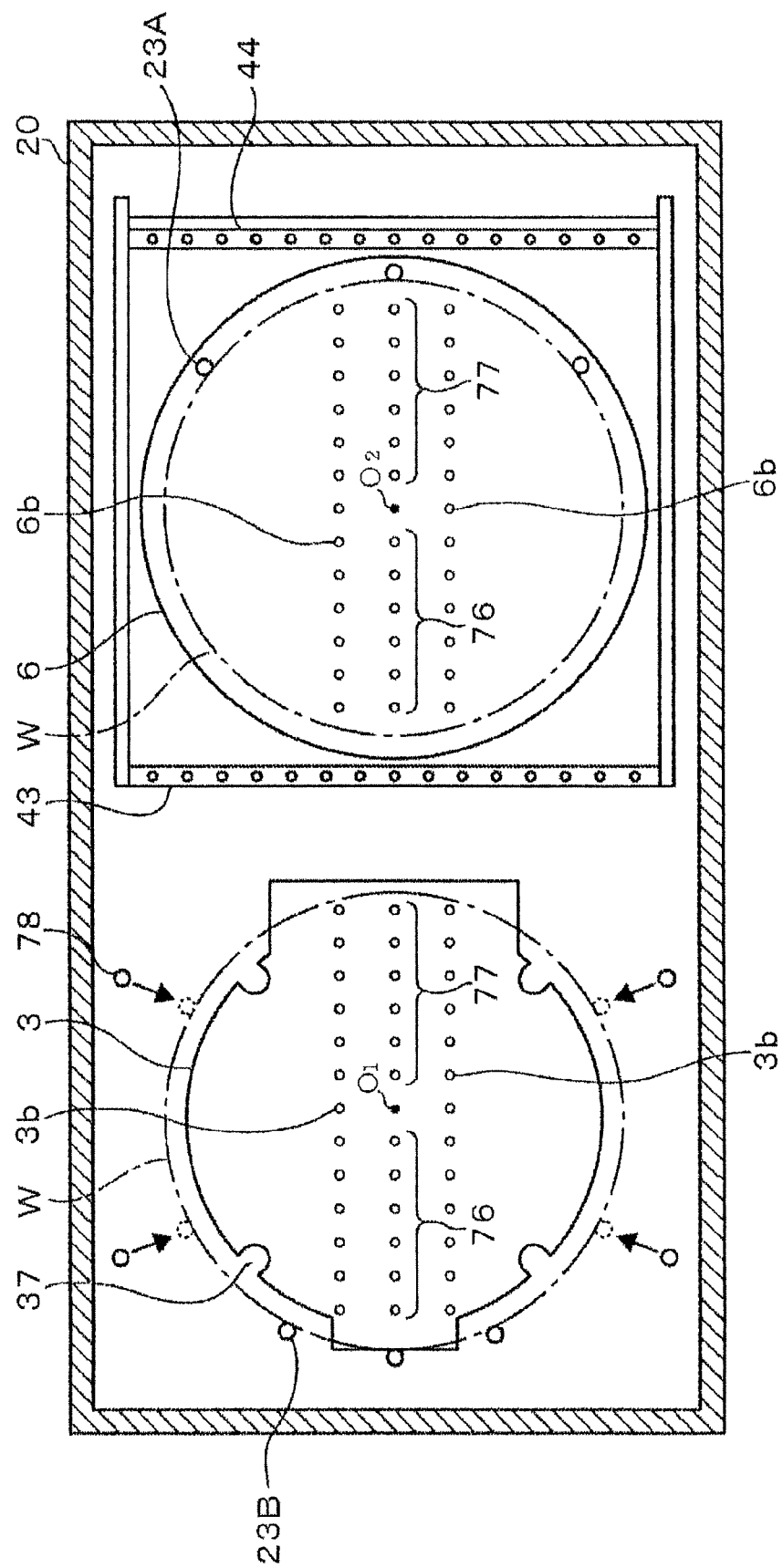
FIG. 14 is a plan view of a heating device in a second modification of the heating device in the first embodiment.
Figure 15:
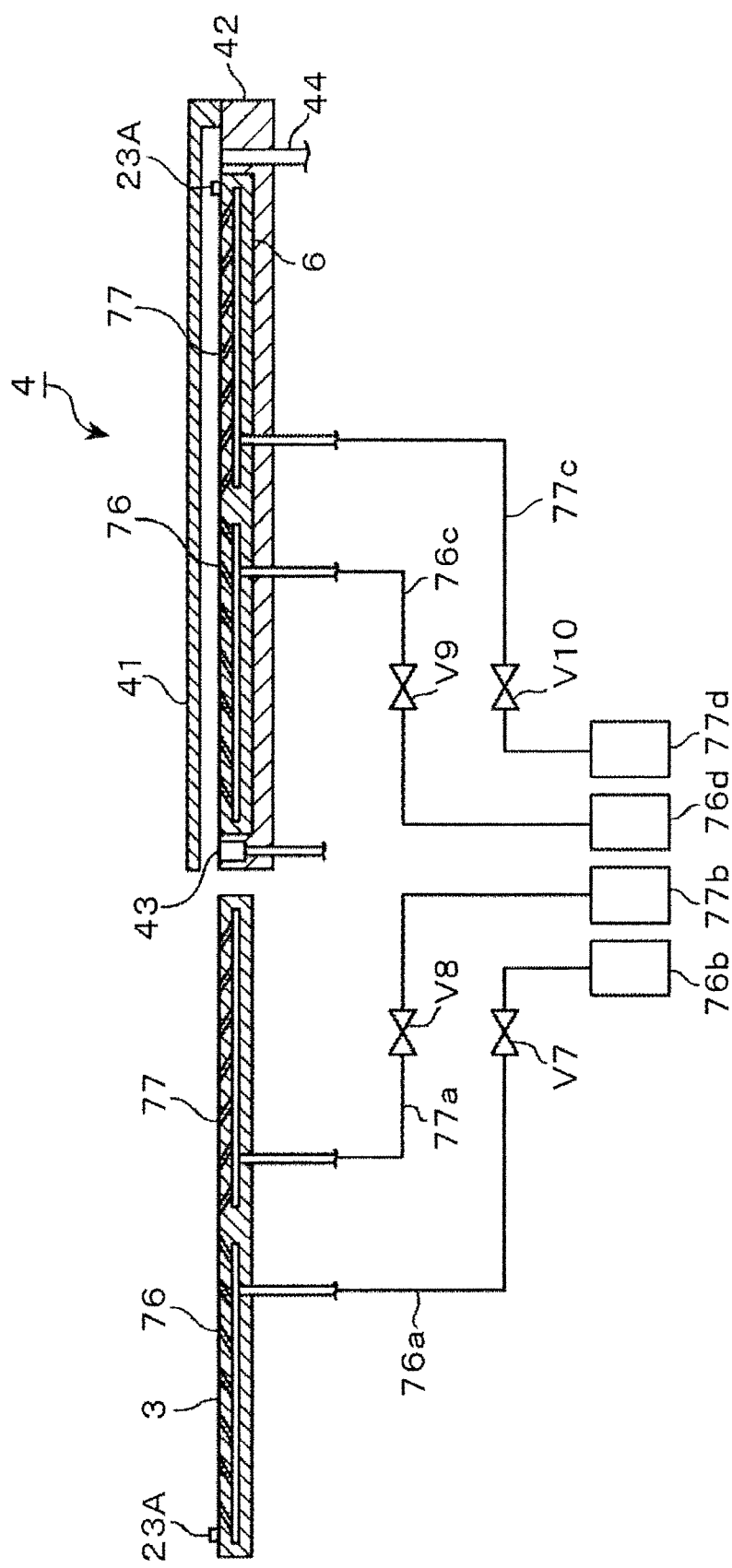
FIG. 15 is a sectional view of the heating device shown in FIG. 14.

The heating device 2 of the present invention may be provided with alignment members 78 as shown in FIG. 14. In the heating device shown in FIG. 14, the alignment members 78 are arranged around the cooling plate 3. The alignment members 78 are moved from positions shown in FIG. 14 toward the cooling plate 3 after the wafer W has been mounted on the cooling plate 3, and are brought into contact with the circumference of the wafer W to position the wafer W at a predetermined position on the cooling plate 6. Alignment members similar to the alignment members 78 may be arranged around the heating plate 6. The wafer moving passage along which the wafer W is moved between the cooling plate 3 and the heating plate 6 may be horizontal or inclined.

Figure 16:
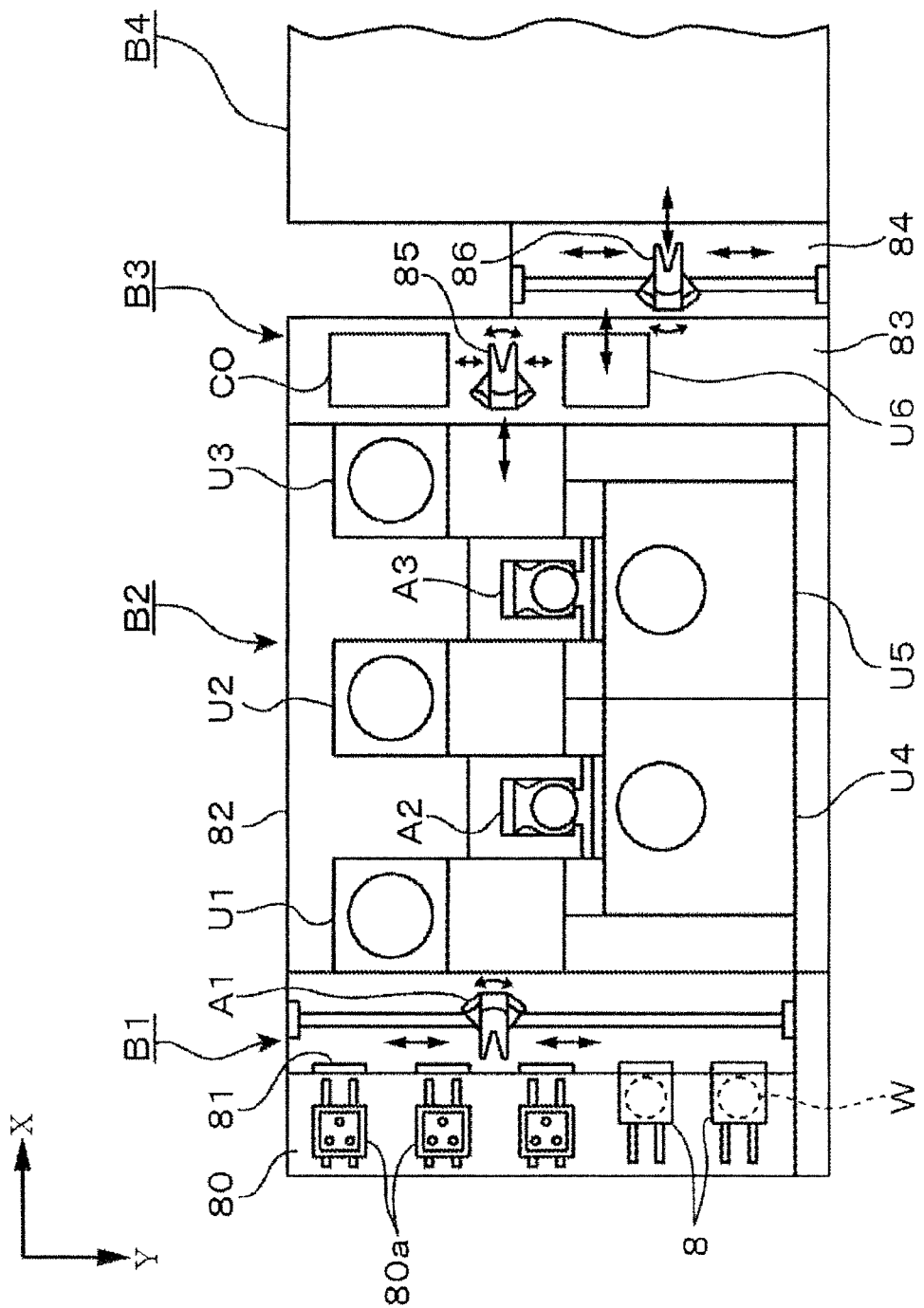
FIG. 16 is a plan view of a resist pattern forming system provided with the heating device in the first embodiment.

A resist pattern forming system will be briefly described with reference to FIGS. 16 and 17. The resist pattern forming system is built by connecting an exposure unit (exposure system) to a coating and developing system including the heating device 2. A carrier handling block B1 receives a carrier 8 containing, for example, thirteen wafers W (substrates) in an airtight fashion and sends out the carrier 8. The carrier handling block B1 includes a carrier station 80 provided with a plurality of carrier holding devices 80a for holding a carrier 8, a wall behind disposed behind the carrier station 80 and provided with closable openings 81, and a transfer means A1 for taking out the wafers W from the carrier 8 through the closable opening 81.

A processing block B2 surrounded by a box 82 is disposed behind and joined to the carrier handling block B1. The processing block B2 includes shelf units U1, U2 and U3 arranged backward in that order, wet processing units U4 and U5, main carrying means A2 and A3 for transferring a wafer W between the shelf units U1 to U3 and the wet processing units U4 and U5. Each of the shelf units U1, U2 and U3 is built by stacking heating and cooling units in layers. The shelf units U1 to U3 and the main carrying means A2 and A3 are arranged alternately. The shelf units U1, U2 and U3 and the main carrying means A2 and A3 are arranged longitudinally on a line. Openings, not shown, through which a wafer W is carried are formed at joints of the shelf units U1, U2 and U3 and the main carrying means A2 and A3. A wafer W can be freely moved from the shelf unit U1 on one side of the processing block B2 to the shelf unit U3 on the other side of the processing block B2.

Each of the shelf units U1, U2 and U3 is built by stacking various devices for processing a wafer W by pretreatment processes before the wafer W is processed by the wet processing units U4 and U5 and for processing a wafer by posttreatment processes after the wafer W has been processed by the wet processing units U4 and U5 in, for example, ten layers. The devices of each of the shelf units U1, U2 and U3 are transfer devices, hydrophobicity imparting devices (ADH), temperature adjusting devices (CPL) for adjusting the temperature of a wafer W to a predetermined temperature, heating devices (BAKE) for processing a wafer W by a heating process before applying a liquid resist to the wafer W, heating devices (PAB) called prebaking devices for processing a wafer W coated with a liquid resist film by a heating process, and heating devices (POST) called postbaking devices for processing a wafer W by a heating process after the wafer W has been processed by a developing process. The heating units (PAB) are the heating devices 2 of the present invention.

Figure 17:
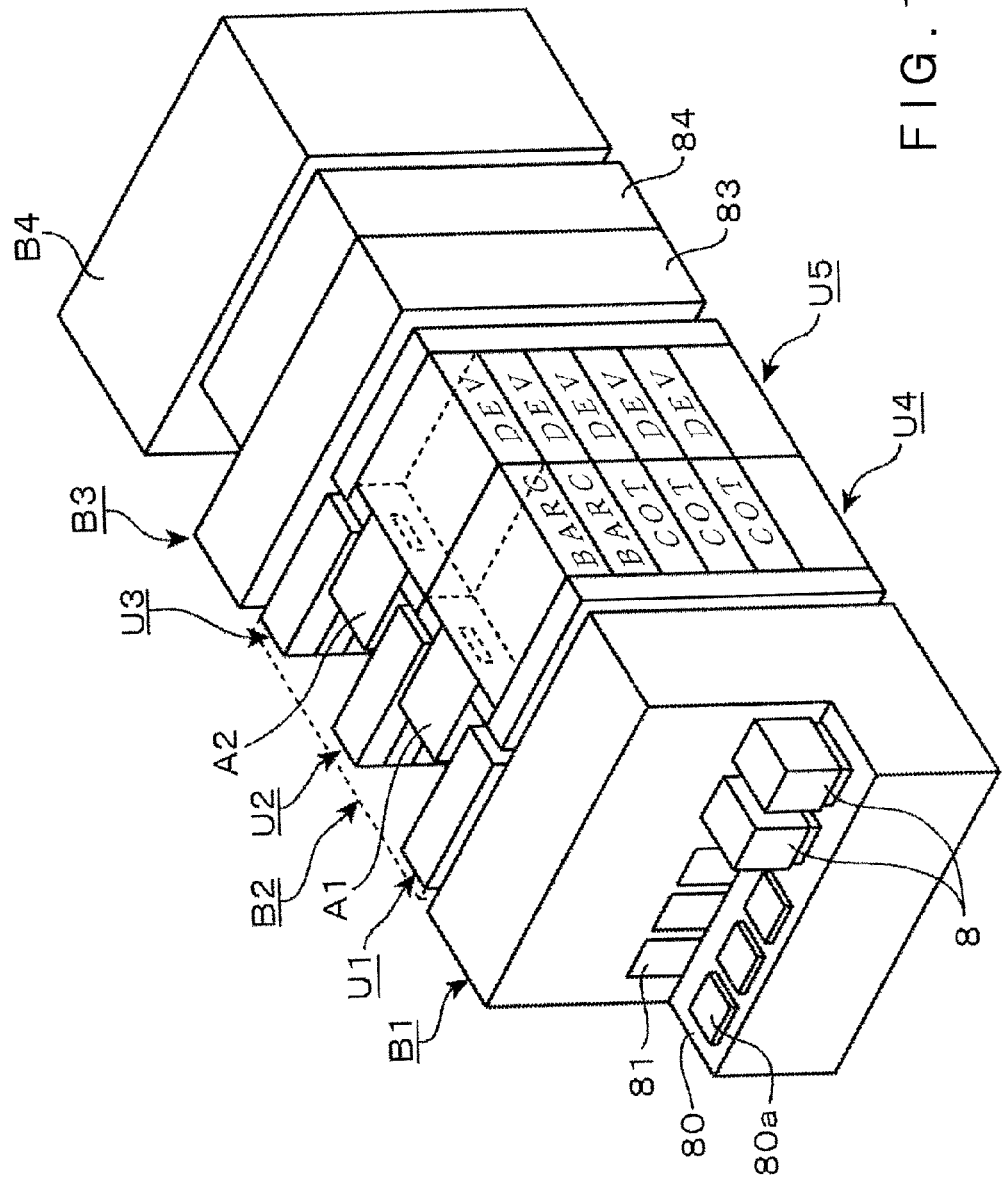
FIG. 17 is a perspective view of the resist pattern forming system shown in FIG. 16.
Figure 18:
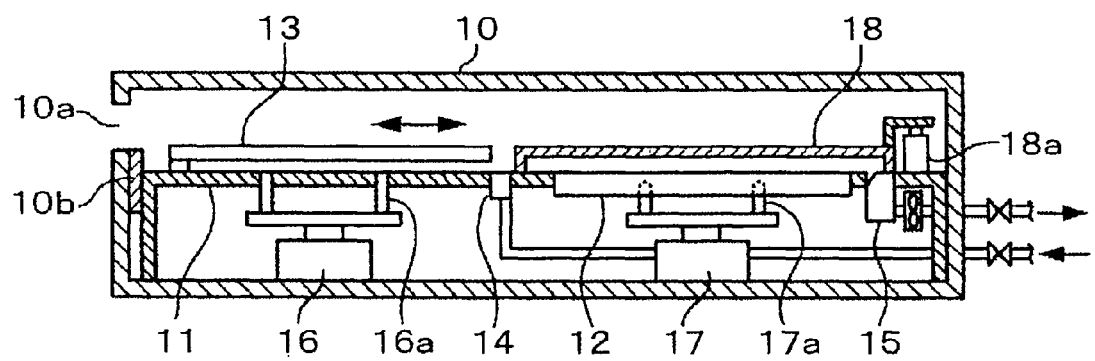
FIG. 18 is a sectional view of a known heating device.
Figure 19:
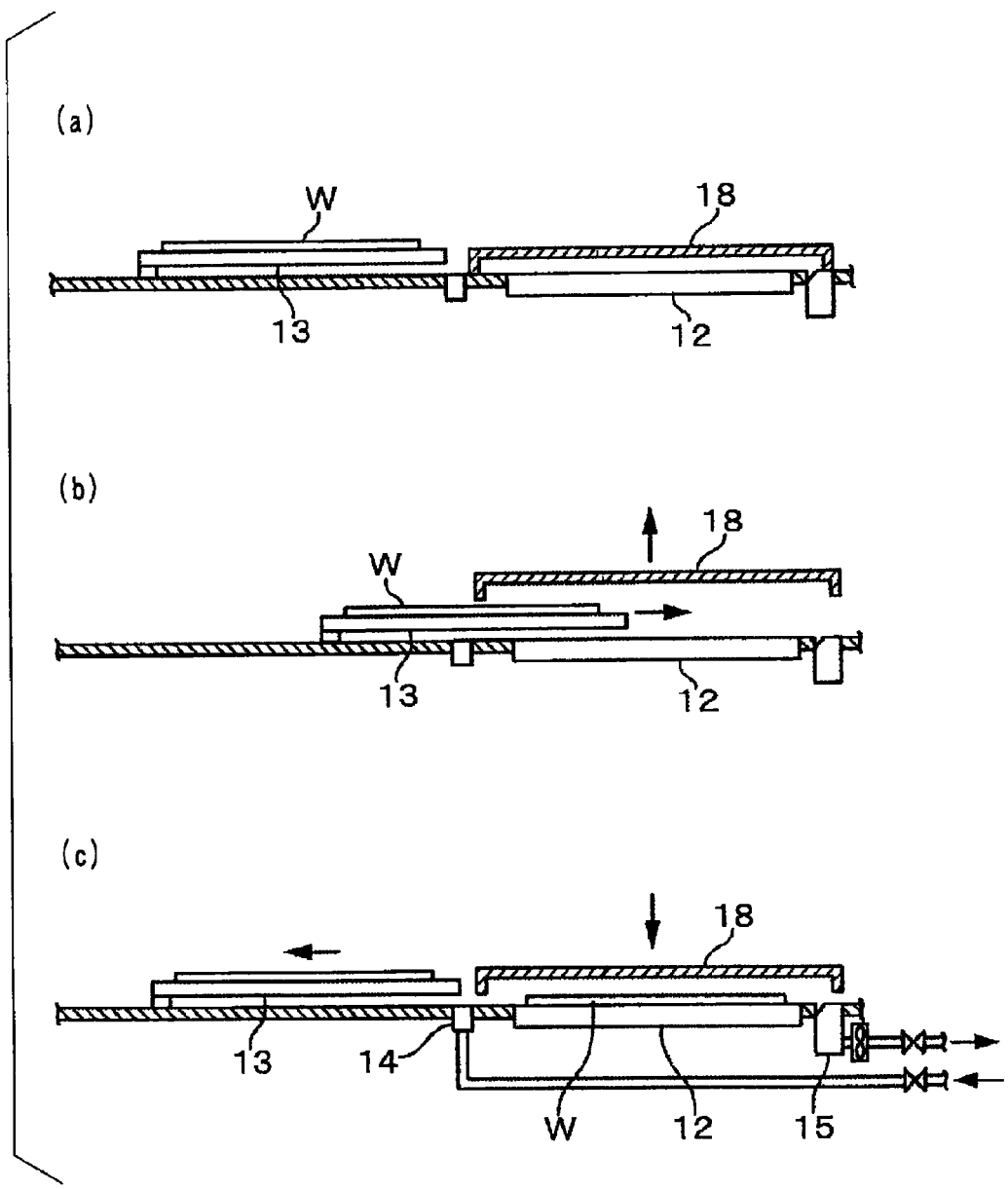
FIGS. 19(a), 19(b) and 19(c) are sectional views of assistance in explaining the operation of the known heating device shown in FIG. 18.

As shown by way of example in FIG. 17, the wet processing unit U4 is built by stacking antireflection film forming devices (BARC) and coating devices (COT) for coating a wafer W with a liquid resist film in, for example, five layers, and the wet processing unit U5 is built by stacking developing devices (DEV) for processing a wafer W by a developing process in, for example, five layers.

A developing system B4 is connected to the shelf unit U3 of the processing block B2 by an interface block B3. The interface block B3 has a first carrying chamber 83 and a second carrying chamber 84 longitudinally arranged between the processing block B2 and the exposure system B4. A first carrying arm 85 and a second carrying arm 86 are placed in the first carrying chamber 83 and the second carrying chamber 84, respectively. The first carrying arm 85 and the second carrying arm 86 can move vertically, can turn about a vertical axis and can move transversely. A shelf unit U6 is disposed in the first carrying chamber 83. The shelf unit U6 is built by stacking, for example, transfer devices, precision temperature adjusting devices (CPL) and heating and cooling devices (PEB) for processing a wafer W by a postexposure baking process.

The flow of a wafer W in the resist pattern forming system will be described by way of example. A wafer W taken out from the carrier 8 delivered to the carrier handling block B1 is transferred successively to the temperature adjusting device (CPL), the antireflection film forming device (BARC), the heating device (BAKE), the temperature adjusting device (CPL), the coating device (COT), the heating device (PAB) and the exposure system B4 in that order. The wafer W is subjected to the exposure process by the exposure system B4. Then, the wafer W processed by the exposure process is transferred successively to the heating device (PEB), the precision temperature adjusting device (CPL), the developing device (DEV), the heating device (POST), the temperature adjusting device (CPL) and the carrier handling block B1 in that order. The wafer W is returned to the carrier 8.

The present invention is applicable not only to the heating process (baking process) for heating the wafer W coated with a liquid resist film, but also to the heating process (PEB) for heating the wafer W processed by the exposure process and heating the wafer W processed by the developing process, and to the hydrophobicity imparting device (ADH). When the heating device 2 is used as the hydrophobicity imparting device (ADH), an atmosphere of HMDS (hexamethyldisilane) or the like is supplied into the heating chamber 4 by the gas discharge device 43. The present invention is applicable not only to processing a semiconductor wafer, but also to processing LCD substrates, mask substrates and such.

What is claimed is:

1. A heating device comprising:
 a processing vessel defining a flat heating chamber in which a substrate is subjected to a heating process and having an end wall provided with an opening through which the substrate is carried into and carried out of the heating chamber;
 a heating plate placed in the heating chamber;
 a cooling plate disposed contiguously with the end wall provided with the opening of the heating chamber to cool the substrate heated by the heating plate;
 flotation gas spouting ports, through which a gas is spouted obliquely upward toward either of opposite first and second ends of a substrate moving passage to float the substrate and to move the substrate, formed in the cooling plate and the heating plate and arranged along the substrate moving passage;

a pushing member for applying pushing force to a front or a rear end, with respect to a moving direction in which the substrate is moved, of the floated substrate when the substrate is moved; and a driving mechanism for driving the pushing member, and a controller for controlling the driving mechanism, wherein the controller controls the driving mechanism so that the substrate is floated above the cooling plate and is moved to the heating plate for being subjected to a heating process at the heating chamber, and so that the substrate heat-processed at the heating chamber is moved back to the cooling plate, and the driving mechanism drives the pushing member:

such that the pushing member applies pushing force to the substrate to move the substrate horizontally in a direction opposite to a gas spouting direction in which the gas is spouted through the flotation gas spouting ports, by moving the pushing member in the direction opposite to the gas spouting direction, against force exerted by the gas on the substrate, and such that a force is applied between the pushing member and the substrate during movement of the substrate horizontally in the gas spouting direction, in which the gas is spouted through the flotation gas spouting ports, by moving the pushing member in the gas spouting direction in a state where the substrate is pressed against the pushing member by the gas spouted through the flotation gas spouting ports.

2. The heating device according to claim 1, wherein the first end of the substrate moving passage is on the side of the cooling plate, and the pushing member is on the side of the second end of the cooling plate with respect to a direction in which the substrate is moved from the cooling plate to the heating plate.

3. The heating device according to claim 2, wherein the heating plate and the cooling plate are provided with centering gas spouting ports arranged along the substrate moving passage on the opposite sides of a center line of the substrate moving passage and formed so as to spout the gas toward a vertical plane containing the center line to make the substrate float above the center line.

4. The heating device according to claim 2, wherein the cooling plate and/or the heating plate is provided with positioning members for positioning the substrate moved along the substrate moving passage at a predetermined stopping position.

5. The heating device according to claim 1, wherein the heating plate and the cooling plate are provided with centering gas spouting ports arranged along the substrate moving passage on the opposite sides of a center line of the substrate moving passage and formed so as to spout the gas toward a vertical plane containing the center line to make the substrate float above the center line.

6. The heating device according to claim 5, wherein the flotation gas spouting ports for spouting the gas to float the substrate serve also as centering gas spouting ports.

7. The heating device according to claim 5, wherein the cooling plate and/or the heating plate is provided with positioning members for positioning the substrate moved along the substrate moving passage at a predetermined stopping position.

8. The heating device according to claim 1, wherein the cooling plate and/or the heating plate is provided with positioning members for positioning the substrate moved along the substrate moving passage at a predetermined stopping position.

9. A heating device comprising:

a processing vessel defining a flat heating chamber in which a substrate is subjected to a heating process and having an end wall provided with an opening through which the substrate is carried into and carried out of the heating chamber;

a heating plate placed in the heating chamber;

a cooling plate disposed contiguously with the end wall provided with the opening of the heating chamber to cool the substrate heated by the heating plate;

forward flotation gas spouting ports, through which a gas is spouted obliquely upward toward a second end of a substrate moving passage opposite a first end of the substrate moving passage on the side of the cooling plate to float the substrate and to propel for moving the substrate from the side of the cooling plate toward the heating chamber, formed in the cooling plate and the heating plate and arranged along the substrate moving passage;

backward flotation gas spouting ports, through which a gas is spouted obliquely upward toward the first end of the substrate moving passage to float the substrate and to propel for moving the substrate from the side of the heating chamber toward the cooling plate, formed in the cooling plate and the heating plate and arranged along the substrate moving passage; and centering gas spouting ports formed in the heating plate and the cooling plate, arranged along the substrate moving passage on the opposite sides of a center line of the substrate moving passage and formed so as to spout the gas toward a vertical plane containing the center line to make the substrate float above the center line, wherein the substrate is moved from the cooling plate to the heating plate by the gas spouted through the forward floatation gas spouting ports for being subjected to a heating process at the heating chamber and the substrate heat-processed at the heating chamber is moved back to the cooling plate by the gas spouted through the backward flotation gas spouting ports.

10. The heating device according to claim 9, wherein the forward flotation gas spouting ports and the backward flotation gas spouting ports are arranged on the same straight line extending along the substrate moving passage.

11. The heating device according to claim 10, wherein the flotation gas spouting ports serve also as centering gas spouting ports.

12. The heating device according to claim 10, wherein the cooling plate and/or the heating plate is provided with positioning members for positioning the substrate moved along the substrate moving passage at a predetermined stopping position.

13. The heating device according to claim 9, wherein the forward flotation gas spouting ports and the backward flotation gas spouting ports are arranged on different straight lines extending along the substrate moving passage, respectively.

14. The heating device according to claim 13, wherein the flotation gas spouting ports serve also as centering gas spouting ports.

15. The heating device according to claim 13, wherein the cooling plate and/or the heating plate is provided with positioning members for positioning the substrate moved along the substrate moving passage at a predetermined stopping position.

16. The heating device according to claim 9, wherein the flotation gas spouting ports serve also as centering gas spouting ports.

17. The heating device according to claim 16, wherein the cooling plate and/or the heating plate is provided with positioning members for positioning the substrate moved along the substrate moving passage at a predetermined stopping position.

18. The heating device according to claim 9 wherein the cooling plate and/or the heating plate is provided with positioning members for positioning the substrate moved along the substrate moving passage at a predetermined stopping position.

19. A heating method to be carried out by a heating device provided with a heating plate for heating a substrate and a cooling plate for cooling the substrate, and designed to move the substrate between the heating plate and the cooling plate, said heating method comprising the steps of:

placing a substrate on the cooling plate;

spouting a flotation gas for floating the substrate obliquely upward toward a first end of a substrate moving passage or toward a second end opposite the first end of the substrate moving passage to float the substrate above the cooling plate;

moving the substrate floating above the cooling plate toward the heating plate in a direction opposite a direction in which the flotation gas is spouted by applying pushing force to a back part of the substrate with respect to a direction in which the substrate is moved by a pushing member against pushing force exerted on the substrate by the flotation gas spouted through the flotation gas spouting ports or moving the substrate in the direction in which the flotation gas is spouted through the flotation gas spouting ports by applying pushing force to front part of the substrate with respect to the moving direction of the substrate by moving the pushing member in the direction in which the flotation gas is spouted;

subjecting the substrate to a heating process by stopping spouting the flotation gas through the flotation gas spouting ports of the heating plate to place the substrate on the heating plate;

floating the substrate above the heating plate by spouting the flotation gas through the flotation gas spouting ports of the cooling plate and the heating plate obliquely upward toward the first or the second end of the substrate moving passage; and moving the substrate toward the cooling plate by moving the substrate in a direction in which the flotation gas is spouted by applying pushing force to the front part of the substrate with respect to a direction in which the substrate is moved by the pushing member or by moving the substrate in a direction opposite a direction in which the flotation gas is spouted through the flotation gas spouting ports by applying pushing force to the back of the substrate with respect to the moving direction of the substrate against pushing force exerted on the substrate by the flotation gas spouted through the flotation gas spouting ports.

* * * * *